(12) United States Patent
Shima

(10) Patent No.: US 7,994,586 B2
(45) Date of Patent: Aug. 9, 2011

(54) SEMICONDUCTOR DEVICE AND MANUFACTURING METHOD OF THE SAME

(75) Inventor: Masashi Shima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 171 days.

(21) Appl. No.: 12/411,016

(22) Filed: Mar. 25, 2009

(65) Prior Publication Data

US 2009/0179278 A1 Jul. 16, 2009

Related U.S. Application Data

(63) Continuation of application No. PCT/JP2006/319579, filed on Sep. 29, 2006.

(51) Int. Cl.
*H01L 27/092* (2006.01)
*H01L 21/8238* (2006.01)

(52) U.S. Cl. ......... 257/369; 257/E21.635; 257/E27.062; 438/199

(58) Field of Classification Search .................. 257/213, 257/288, 368–389, E21.632, E21.635, E21.637, 257/E27.06–E27.067; 438/142, 197, 199–233
See application file for complete search history.

(56) References Cited

U.S. PATENT DOCUMENTS

| 6,982,465 | B2 | 1/2006 | Kumagai et al. |
| 7,115,954 | B2 | 10/2006 | Shimizu et al. |
| 7,411,253 | B2 | 8/2008 | Shimizu et al. |
| 7,414,293 | B2 | 8/2008 | Shimizu et al. |
| 2004/0029323 | A1 | 2/2004 | Shimizu et al. |
| 2004/0075148 | A1 | 4/2004 | Kumagai et al. |
| 2005/0112817 | A1* | 5/2005 | Cheng et al. ................. 438/219 |
| 2006/0118880 | A1 | 6/2006 | Komoda |
| 2007/0023843 | A1 | 2/2007 | Shimizu et al. |
| 2007/0102768 | A1 | 5/2007 | Shimizu et al. |
| 2008/0079034 | A1 | 4/2008 | Komoda |
| 2008/0303091 | A1 | 12/2008 | Shimizu et al. |

FOREIGN PATENT DOCUMENTS

JP 8-274187 A 10/1996
(Continued)

OTHER PUBLICATIONS

International Search Report of PCT/JP2006/319579, Mailing Date of Jan. 9, 2007.

(Continued)

*Primary Examiner* — Minh-Loan T Tran
*Assistant Examiner* — Kevin Quinto
(74) *Attorney, Agent, or Firm* — Westerman, Hattori, Daniels & Adrian, LLP

(57) ABSTRACT

In a p-type MOS transistor, a gate electrode is partially removed by a predetermined wet etching, so that an upper portion of the gate electrode is formed to be lower than an upper portion of a sidewall insulation film. As a result of such a constitution, in spite of formation of a tensile stress (TSEL) film leading to deterioration of characteristics of a p-type MOS transistor by nature, stresses applied from the TESL film to the gate electrode and the sidewall insulation film are dispersed as indicated by broken arrows in the drawing, and consequently, a compressive stress is applied to a channel region, so that a compressive strain is introduced. As stated above, in the p-type MOS transistor, in spite of formation of the TESL film, in reality, a strain to improve characteristics of the p-type MOS transistor is given to the channel region.

10 Claims, 31 Drawing Sheets

FOREIGN PATENT DOCUMENTS

| | | |
|---|---|---|
| JP | 9-289249 A | 11/1997 |
| JP | 2003-045996 A | 2/2003 |
| JP | 2003-86708 A | 3/2003 |
| JP | 2006-59980 A | 3/2006 |
| JP | 2006-165335 A | 6/2006 |
| JP | 2006-237263 A | 9/2006 |
| WO | 02/43151 A1 | 5/2002 |

OTHER PUBLICATIONS

Notification of Transmittal of Translation of the International Preliminary Report on Patentablity (Form PCT/IB/338) of International Application No. PCT/JP2006/0319579 mailed on Apr. 9, 2009 with Forms and PCT/IB/373 and PCT/ISA/237.

* cited by examiner

P-MOS

P-MOS

N-MOS

N-MOS

US 7,994,586 B2

SEMICONDUCTOR DEVICE AND MANUFACTURING METHOD OF THE SAME

TECHNICAL FIELD

The present embodiments discussed herein are directed to a semiconductor device realizing an operation of high-speed and low power consumption by applying a predetermined strain to a channel of a transistor to increase a drive current, and to a manufacturing method of the same.

BACKGROUND ART

Recently, requests for further miniaturization and high-integration of a semiconductor device have been increasing, and miniaturization of a MOS transistor according to a scaling law is already close to a limit. When miniaturization proceeds in such a manner, simple scaling of a gate length does not improve MOS device characteristics or circuit characteristics any more, and, on the contrary, rapidly brings about deterioration. However, when considering a reduction of a chip size or the like, it is essential to miniaturize a device size with generations.

In such circumstances, what is called a technology booster is getting introduced as a technology to further improve transistor characteristics at a scaling time of a gate length. Thereamong, a strained silicon technology can be cited as a technology being developed as the most promising technology. The strained silicon technology is a technology to improve transistor characteristics by applying a strain to a channel region of a MOS transistor by improving mobility of a carrier. As methods of a strain introduction to the channel region, there are developed a technique to embed materials having a lattice constant different from that of silicon into a source/drain region, a technique to control the strain by adjusting a formation condition of a gate insulation film as in Patent Document 1, and so on. Nowadays, the strain silicon technology has become essential as a characteristics improvement technology at a low cost, and it is important to improve the strain silicon technology for further improvement of characteristics of a CMOS transistor.

However, the former technique requires ion-implanting of different substances and different conditions for an n-type MOS transistor and for a p-type MOS transistor, while the latter technique requires forming with different film materials and a different number of layers for an n-channel MOS transistor and for a p-channel MOS transistor (hereinafter, referred to as n-type and p-type MOS transistors). In other words, in the above cases, there are problems that the number of processes increases, and furthermore, that a complicated and complex process is added. Further, even when control of the strain is tried with such an increase of the process number, it is difficult to effectively introduce strains appropriate for the n-type and p-type MOS transistors.

Thus, there is actively studied a technology to form an insulation film having a property of applying a tensile stress or a compressive stress to a channel region as a contact etching stop film (insulation film functioning as an etching stopper at a time of formation of a contact hole to a source/drain region in an interlayer insulation film) covering a gate electrode.

FIG. 33A and FIG. 33B are schematic cross-sectional views illustrating states that desired stresses are applied to channel regions. It should be noted that in FIG. 33A and FIG. 33B, source/drain regions are omitted for the sake of illustrative convenience.

As for an n-type MOS transistor, in order to improve its characteristics, a tensile stress is applied to a channel region, that is, a portion between source/drain regions of a semiconductor substrate to introduce a tensile strain. On the other hand, as for a p-type MOS transistor, in contrast, in order to improve its characteristics, it is necessary to apply a compressive stress to a channel region to introduce a compressive strain.

An n-type transistor is exemplified in FIG. 33A. In this n-type MOS transistor 100, a gate electrode 103 is pattern-formed on a silicon semiconductor substrate 101 via a gate insulation film 102, and a sidewall insulation film 104 is formed in a manner to cover only both side surfaces of the gate electrode 103. The sidewall insulation film 104 is formed, as necessary, to have a two-layer structure of an inside sidewall insulation film 104a and an outside sidewall insulation film 104b covering the inside sidewall insulation film 104a as illustrated.

In both sides of the gate electrode 103 are formed undepicted source/drain regions being a pair of n-type impurity diffusion regions made by introduction of a predetermined n-type impurity, while on an upper surface of the gate electrode 103 and upper surfaces of the source/drain regions are each formed silicide layers 105 for lower resistance. Further, a tensile stress film 106 which functions also as a contact etching stopper is formed on an entire surface in a manner to cover the gate electrode 103 and the sidewall insulation film 104. The tensile stress film 106 is an insulation film having a property of applying a tensile stress to the outside by contracting itself.

As described above, by forming the tensile stress film 106, stresses are applied in directions indicated by arrows in FIG. 33A and a tensile stress is applied to a channel region, so that a tensile strain is introduced.

On the other hand, as for a p-type MOS transistor 200, as illustrated in FIG. 33B, a gate electrode 203 is pattern-formed on a silicon semiconductor substrate 101 via a gate insulation film 202, and a sidewall insulation film 204 is formed in a manner to cover only both side surfaces of the gate electrode 203. The sidewall insulation film 204 is formed, as necessary, to have a two-layer structure of an inside sidewall insulation film 204a and an outside sidewall insulation film 204b covering the inside sidewall insulation film 204a as illustrated.

In both sides of the gate electrode 203 are formed undepicted source/drain regions being a pair of p-type impurity diffusion regions made by introduction of a predetermined p-type impurity, while on an upper surface of the gate electrode 203 and upper surfaces of the source/drain regions are each formed silicide layers 205 for lower resistance.

In the p-type MOS transistor 200, in order to improve characteristics, it is necessary to apply stresses in directions indicated by arrows in FIG. 33B and to apply a compressive stress to a channel region so that a compressive strain is introduced.

Patent Document 1: Japanese Laid-open Patent Publication No. 2003-45996

As described above, when introducing a strain into a channel region by using a contact etching stop film, it is necessary to apply stresses reverse to each other for an n-type MOS transistor and a p-type MOS transistor. Therefore, in a CMOS transistor being a complementary semiconductor device having an n-type MOS transistor and a p-type MOS transistor, in order to improve respective characteristics of the n-type MOS transistor and the p-type MOS transistor, it is necessary to form, as contact etching stop films, a tensile stress film for a p-type MOS transistor side and a compressive stress film for an n-type MOS transistor side, separately.

However, in a manufacturing process of the CMOS transistor, forming two kinds of contact etching stop films having properties different from each other as described above leads to an increase of the number of process steps and complication of the process. Thus, conventionally, more emphasis is placed on prevention of the increase of the number of process steps and complication of the process, and the CMOS transistor is created with either one of the n-type MOS transistor and the p-type MOS transistor being sacrificed. In such a case, if, for example, the tensile stress film is formed as the contact etching stop film in a manner to cover both the n-type MOS transistor and the p-type MOS transistor, the characteristics of the n-type MOS transistor can be improved, but deterioration of the characteristics of the p-type MOS transistor have to be accepted.

In one conductivity transistor, in spite of formation of an etching stop film which ordinarily has a property of giving a channel region a strain to improve characteristics of the other conductivity transistor and which gives the channel region a strain to deteriorate characteristics of that one conductivity transistor, in reality, a strain to improve characteristics of the transistor is given to the channel region and improvement of the characteristics of that one conductivity transistor is realized. An object of the present embodiments is, eventually in a complementary semiconductor device, in spite of formation of an etching stop film which ordinarily has a property of improving characteristics of one conductivity transistor and deteriorating characteristics of the other conductivity transistor in a manner to cover both n-channel transistor side and p-channel transistor side in order to prevent an increase of the number of process steps and complication of the process, to concurrently improve the characteristics of both the transistors and to realize a highly reliable semiconductor device and a manufacturing method thereof.

SUMMARY

According to an aspect of the invention, a semiconductor device of the present embodiments is a semiconductor device including a p-channel type transistor in a semiconductor region, the p-channel type transistor including: a first gate electrode formed above the semiconductor region; a first sidewall insulation film formed on both side surfaces of the first gate electrode; a pair of p-type impurity diffusion regions formed in both sides of the first gate electrode; and a tensile stress insulation film formed to cover at least the first gate electrode and the first sidewall insulation film, wherein an upper portion of the first gate electrode is formed to be lower than an upper portion of the first sidewall insulation film.

Another aspect of the semiconductor device of the present embodiments is a semiconductor device including an n-channel type transistor in a semiconductor region, the n-channel type transistor including: a second gate electrode formed above the semiconductor region; a second sidewall insulation film formed on both side surfaces of the second gate electrode; a pair of n-type impurity diffusion regions formed in both sides of the second gate electrode; and a compressive stress insulation film formed to cover at least the second gate electrode and the second sidewall insulation film, wherein an upper portion of the second gate electrode is formed to be lower than an upper portion of the second sidewall insulation film.

According to an aspect of the invention, a manufacturing method of a semiconductor device is a manufacturing method of a semiconductor device including a p-channel type transistor in a semiconductor region, the method including: forming a first gate electrode above the semiconductor region; forming a first sidewall insulation film on both side surfaces of the first gate electrode; forming a pair of p-type impurity diffusion regions in both sides of the first gate electrode; and forming a tensile stress insulation film to cover at least the first gate electrode and the first sidewall insulation film, wherein an upper portion of the first gate electrode is formed to be lower than an upper portion of the first sidewall insulation film.

Another aspect of a manufacturing method of a semiconductor device of the present embodiments is a manufacturing method of a semiconductor device including an n-channel type transistor in a semiconductor region, the method including: forming a second gate electrode above the semiconductor region; forming a second sidewall insulation film on both side surfaces of the second gate electrode; forming a pair of n-type impurity diffusion regions in both sides of the second gate electrode; and forming a compressive stress insulation film to cover at least the second gate electrode and the second sidewall insulation film, wherein an upper portion of the second gate electrode is formed to be lower than an upper portion of the second sidewall insulation film.

DETAILED DESCRIPTION OF THE EMBODIMENTS

The present inventor finds that a direction of a stress applied to a channel region can be changed by devising shapes of a gate electrode and a sidewall insulation film. Thus, as a result of keen examination to freely control the direction of the stress, the present inventor has reached the present embodiments.

In the present embodiments, as for a gate electrode and a sidewall insulation film, an upper portion of the gate electrode is formed to be lower than an upper portion of the sidewall insulation film. By such a constitution, a stress to be applied to a channel region is changed to be a stress in a reverse direction to a direction of a stress by an etching stop film.

(1) Case that Gist of Present Embodiments is Applied to P-type MOS Transistor

Figure 1:
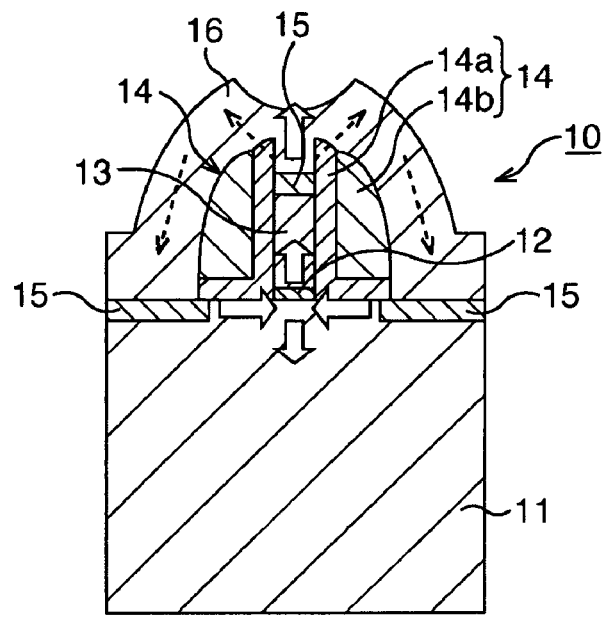
FIG. 1 is a schematic cross-sectional view illustrating a state that the present embodiments are applied to a p-type MOS transistor.

FIG. 1 is a schematic cross-sectional view illustrating a state that the present embodiments are applied to a p-type MOS transistor. It should be noted that source/drain regions are omitted in FIG. 1 for the sake of illustrative convenience.

In a p-type MOS transistor 10, a gate electrode 13 is pattern-formed on a silicon semiconductor substrate 11 via a gate insulation film 12, and a sidewall insulation film 14 is formed in a manner to cover only both side surfaces of the gate electrode 13. The sidewall insulation film 14 is formed to have a two-layer structure of an inside sidewall insulation film 14a and an outside sidewall insulation film 14b covering the inside sidewall insulation film 14a.

In both sides of the gate electrode 13 are formed the undepicted source/drain regions being a pair of p-type impurity diffusion regions made by introduction of a predetermined p-type impurity, while on an upper surface of the gate electrode 13 and on upper surfaces of the source/drain regions are each formed silicide layers 15 for lower resistance. Further, a tensile stress (TESL) film 16 functioning also as a contact etching stopper is formed on an entire surface in a manner to cover the gate electrode 13 and the sidewall insulation film 14. The TESL film 16 is an insulation film having a property of applying a tensile stress to the outside by contracting itself, and is a film ordinarily improving characteristics of an n-type MOS transistor by being formed in the n-type MOS transistor.

In the above p-type MOS transistor, the gate electrode 13 is partially removed by a predetermined wet etching and an upper portion of the gate electrode 13 is formed to be lower than an upper portion of the sidewall insulation film 14. As a result of such a constitution, though a TESL film leading to deterioration of characteristics of a p-type MOS transistor by nature is formed, stresses applied by the TESL film 16 to the gate electrode 13 and the sidewall insulation film 14 are dispersed as indicated by broken arrows in the drawing, and consequently, a compressive stress is applied to a channel region, so that a compressive strain is introduced. By the above constitution, in spite of formation of the TESL film 16, improvement of characteristics of the p-type MOS transistor 10 can be realized.

As stated above, in the p-type MOS transistor 10, in spite of formation of the TESL film 16 which ordinarily has a property of giving a channel region a strain to improve characteristics of an n-type MOS transistor and which gives the channel region a strain to deteriorate characteristics of the p-type MOS transistor, in reality, a strain to improve the characteristics of the p-type MOS transistor 10 is given to the channel region, so that improvement of the characteristics of the p-type MOS transistor 10 is realized.

Figure 2:
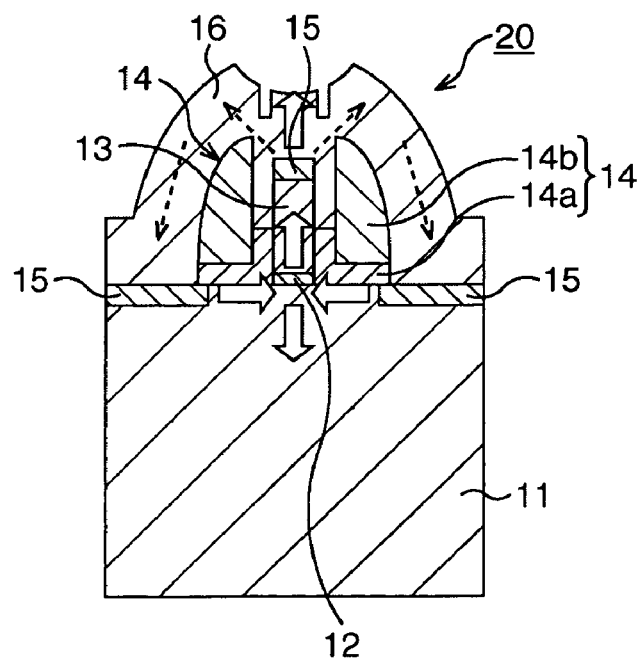
FIG. 2 is a schematic cross-sectional view illustrating a state that another aspect of the present embodiments is applied to a p-type MOS transistor.

FIG. 2 is a schematic cross-sectional view illustrating a state that another aspect of the present embodiments is applied to a p-type MOS transistor. It should be noted that source/drain regions are omitted in FIG. 2 for the sake of illustrative convenience. The same reference numerals are given to the same components as those in FIG. 1 and detailed description will be omitted.

The above p-type MOS transistor 20 is different from the p-type MOS transistor 10 of FIG. 1 in that an inside sidewall insulation film 14a is partially removed by a predetermined wet etching, so that an upper portion of the inside sidewall insulation film 14a is formed to be lower than an upper portion of a gate electrode 13. As described above, by adjusting respective etching amounts of the gate electrode 13 and the inside sidewall insulation film 14a to adjust a height of the gate electrode 13 and a height of the sidewall insulation film 14a properly, magnitudes of stresses applied to the gate electrode 13 and the sidewall insulation film 14 can be adjusted. Thereby, it is possible to meticulously adjust a magnitude (and a direction) of a compressive stress applied to a channel region and thereby to control a degree of a compressive strain to be introduced.

As stated above, in the p-type MOS transistor 20, in spite of formation of a TESL film 16 which ordinarily has a property of giving a channel region a strain to improve characteristics of an n-type MOS transistor and which gives the channel region a strain to deteriorate characteristics of the p-type MOS transistor, in reality, a strain to improve the characteristics of the p-type MOS transistor 20 is given to the channel region, so that improvement of the characteristics of the p-type MOS transistor 20 is realized.

Application of the above-described p-type MOS transistors 10, 20 to a CMOS transistor enables concurrently improving characteristics of both the n-type MOS transistor and the p-type MOS transistor without an increase of the number of process steps.

Figure 3:
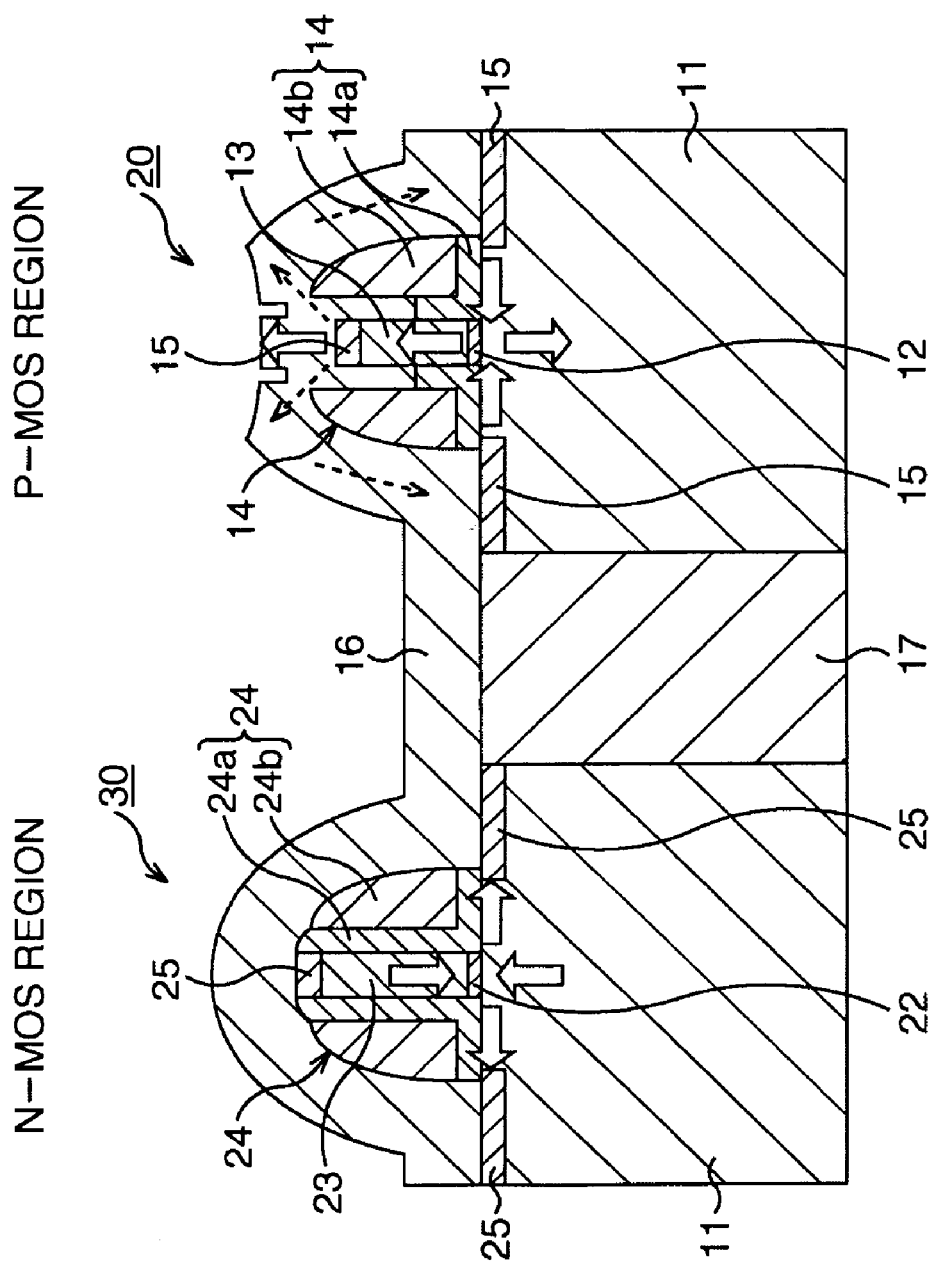
FIG. 3 is a schematic cross-sectional view illustrating a state that the p-type MOS transistor of the present embodiments is applied to a CMOS transistor.

FIG. 3 is a schematic cross-sectional view illustrating a state that the p-type MOS transistor of the present embodiments is applied to a CMOS transistor. It should be noted that source/drain regions are omitted in FIG. 3 for the sake of illustrative convenience. Here, the p-type MOS transistor 20 of FIG. 2 is exemplified as a p-type MOS transistor, but the p-type MOS transistor 10 of FIG. 1 can be also applicable.

In the above CMOS transistor, the p-type MOS transistor 20 of FIG. 2 is formed in a pMOS region while an ordinary n-type MOS transistor 30 is formed in an nMOS region. The p-type MOS transistor 20 and the n-type MOS transistor 30 are electrically isolated by an element isolation structure 17.

In the n-type MOS transistor 30, similarly in the p-type MOS transistor 20, a gate electrode 23 is pattern-formed on a silicon semiconductor substrate 11 via a gate insulation film 22, and a sidewall insulation film 24 is formed in a manner to cover only both side surfaces of the gate electrode 23. The sidewall insulation film 24 is formed to have a two-layer structure of an inside sidewall insulation film 24a and an outside sidewall insulation film 24b covering the inside sidewall insulation film 24a. Here, unsimilarly to in the p-type MOS transistor 20, the gate electrode 23 is not processed in particular after pattern-formed and has a similar height to that of the sidewall insulation film 24.

In both sides of the gate electrode 23 are formed undepicted source/drain regions being a pair of n-type impurity diffusion regions made by introduction of a predetermined n-type impurity, while on an upper surface of the gate electrode 23 and on upper surfaces of the source/drain regions are each formed silicide layers 25 for lower resistance.

Further, a TESL film 16 is formed on an entire surface in a manner to cover an n-type MOS region and a p-type MOS region.

By forming the TESL film 16, in the n-type MOS transistor 30, stresses are applied in directions indicated by arrows in the drawing, and in particular a tensile stress is applied to a channel region, so that a tensile strain is introduced.

In contrast, in the p-type MOS transistor 20, as described above, due to shapes and a positional relation of the gate electrode 13 and the sidewall insulation film 14, stresses in reverse directions to those of the n-type MOS transistor 30 are applied, and to a channel region in particular, a compressive stress is applied, so that a compressive strain is introduced.

As stated above, in the present embodiments, in spite of formation of a TESL film 16 which ordinarily has a property of improving characteristics of an n-type MOS transistor and deteriorating characteristics of a p-type MOS transistor in a manner to cover both n-type MOS transistor side and p-type MOS transistor side in order to prevent an increase of the number of process steps and complication of the process, the characteristics of both the transistor are improved and a highly reliable CMOS transistor is realized.

(2) Case that Gist of Present Embodiments is Applied to N-type MOS Transistor

Figure 4:
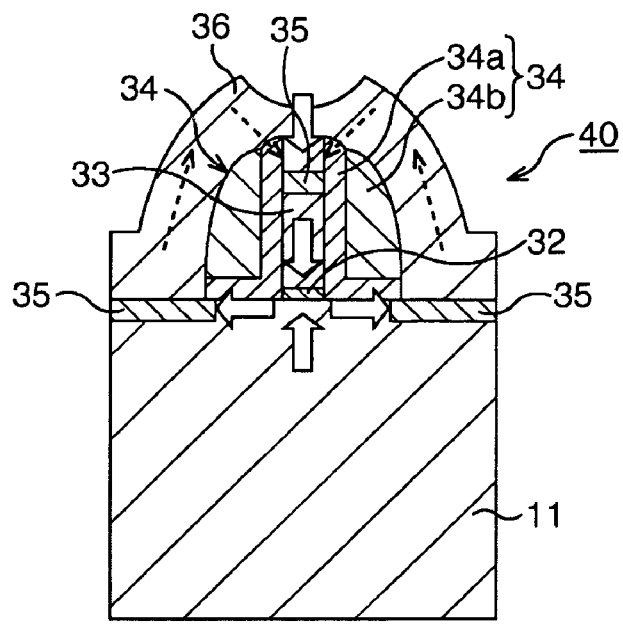
FIG. 4 is a schematic cross-sectional view illustrating a state that the present embodiments are applied to an n-type MOS transistor.

FIG. 4 is a schematic cross-sectional view illustrating a state that the present embodiments are applied to an n-type MOS transistor. It should be noted that source/drain regions are omitted in FIG. 4 for the sake of illustrative convenience.

In a p-type MOS transistor 40, a gate electrode 33 is pattern-formed on a silicon semiconductor substrate 11 via a gate insulation film 32, and a sidewall insulation film 34 is formed in a manner to cover only both side surfaces of the gate electrode 33. The sidewall insulation film 34 is formed to have a two-layer structure of an inside sidewall insulation film 34a and an outside sidewall insulation film 34b covering the inside sidewall insulation film 34a.

In both sides of the gate electrode 33 are formed the undepicted source/drain regions being a pair of n-type impurity diffusion regions made by introduction of a predetermined n-type impurity, while on an upper surface of the gate electrode 33 and on upper surfaces of the source/drain regions are each formed silicide layers 35 for lower resistance. Further, a compressive stress (CESL) film 36 functioning also as a contact etching stopper is formed on an entire surface in a manner to cover the gate electrode 33 and the sidewall insulation film 34. The CESL film 36 is an insulation film having a property of applying a compressive stress to the outside by expanding itself, and is a film ordinarily improving characteristics of a p-type MOS transistor by being formed in the p-type MOS transistor.

In the above n-type MOS transistor, the gate electrode 33 is partially removed by a predetermined wet etching and an upper portion of the gate electrode 33 is formed to be lower than an upper portion of the sidewall insulation film 34. As a result of such a constitution, in spite of formation of the CESL film leading to deterioration of characteristics of an n-type MOS transistor by nature, stresses applied by the CESL film 36 to the gate electrode 33 and the sidewall insulation film 34 are dispersed as indicated by broken arrows in the drawing, and consequently, a tensile stress is applied to a channel region, so that a tensile strain is introduced. By the above constitution, in spite of formation of the CESL film 36, improvement of characteristics of the n-type MOS transistor 40 can be realized.

As stated above, in the n-type MOS transistor 40, in spite of the formation of the CESL film 36 which ordinarily has a property of giving a channel region a strain to improve characteristics of a p-type MOS transistor and which gives the channel region a strain to deteriorate characteristics of the n-type MOS transistor, in reality, a strain to improve the characteristics of the n-type MOS transistor 40 is given to the channel region, so that improvement of the characteristics of the n-type MOS transistor 40 is realized.

Figure 5:
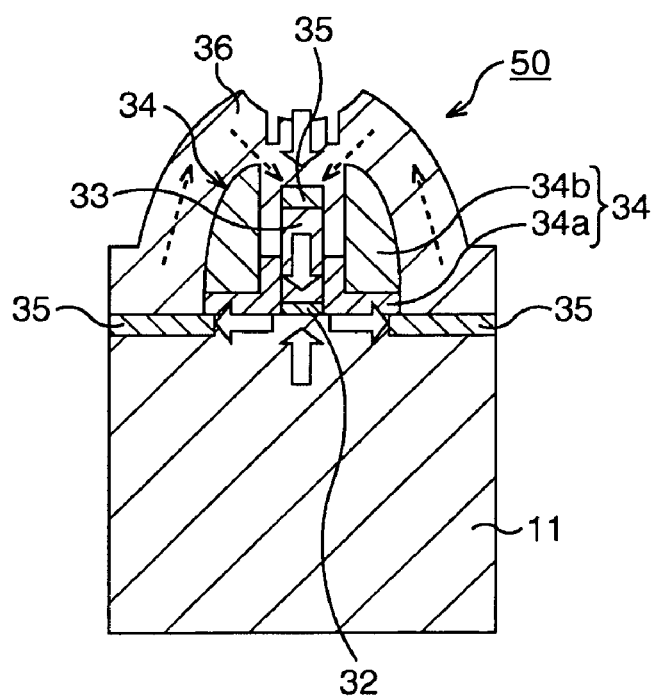
FIG. 5 is a schematic cross-sectional view illustrating a state that another aspect of the present embodiments is applied to an n-type MOS transistor.

FIG. 5 is a schematic cross-sectional view illustrating a state that another aspect of the present embodiments is applied to an n-type MOS transistor. It should be noted that source/drain regions are omitted in FIG. 5 for the sake of illustrative convenience. The same reference numerals are given to the same components as those in FIG. 4 and detailed description will be omitted.

The above n-type MOS transistor 50 is different from the n-type MOS transistor 40 of FIG. 4 in that an inside sidewall insulation film 34a is partially removed by a predetermined wet etching, so that an upper portion of the inside sidewall insulation film 34a is formed to be lower than an upper portion of a gate electrode 33. As described above, by adjusting a height of the inside sidewall insulation film 34a properly, magnitudes of stresses applied to the gate electrode 33 and the sidewall insulation film 34 can be adjusted. Thereby, it is possible to meticulously adjust a magnitude (and a direction) of a tensile stress applied to a channel region and thereby to control a degree of a tensile strain to be introduced.

As stated above, in the n-type MOS transistor 50, in spite of formation of the CESL film 36 which ordinarily has a property of giving a channel region a strain to improve characteristics of a p-type MOS transistor and which gives the channel region a strain to deteriorate characteristics of the n-type MOS transistor, in reality, a strain to improve the characteristics of the n-type MOS transistor 50 is given to the channel region, so that improvement of the characteristics of the n-type MOS transistor 50 is realized.

Application of the above-described n-type MOS transistors 40, 50 to a CMOS transistor enables concurrently improving characteristics of both the n-type MOS transistor and the p-type MOS transistor without an increase of the number of process steps.

Figure 6:
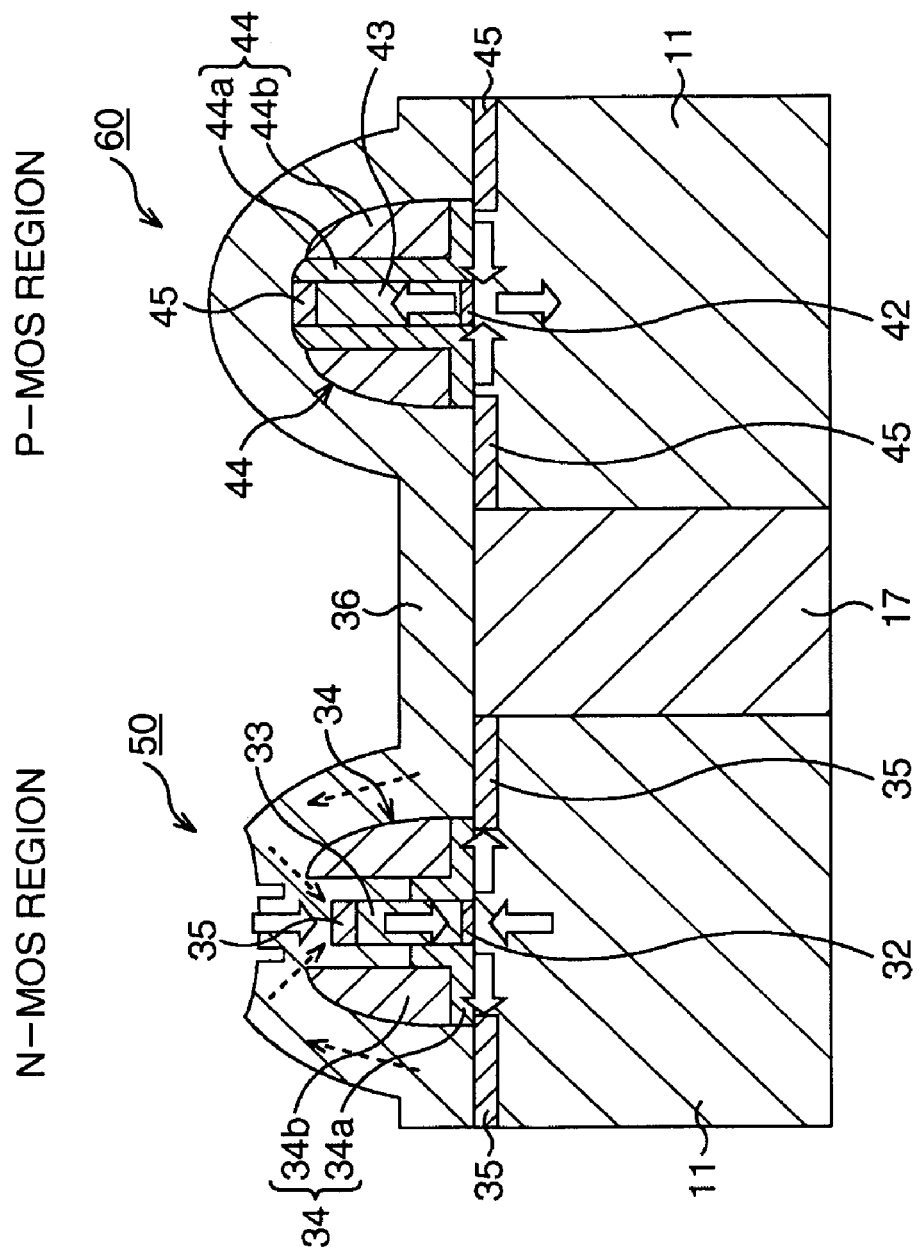
FIG. 6 is a schematic cross-sectional view illustrating a state that the n-type MOS transistor of the present embodiments is applied to a CMOS transistor.

FIG. 6 is a schematic cross-sectional view illustrating a state that the n-type MOS transistor of the present embodiments is applied to a COMS transistor. It should be noted that source/drain regions are omitted in FIG. 6 for the sake of illustrative convenience. Here, the n-type MOS transistor 50 of FIG. 5 is exemplified as an n-type MOS transistor, but the n-type MOS transistor 40 of FIG. 4 can be also applicable.

In this CMOS transistor, the n-type MOS transistor 50 of FIG. 5 is formed in an nMOS region while an ordinary p-type MOS transistor 60 is formed in a pMOS region. The n-type MOS transistor 50 and the p-type MOS transistor 60 are electrically isolated by an element isolation structure 17.

In the p-type MOS transistor 60, similarly to in the n-type MOS transistor 50, a gate electrode 43 is pattern-formed on a silicon semiconductor substrate 11 via a gate insulation film 42, and a sidewall insulation film 44 is formed in a manner to cover only both side surfaces of the gate electrode 43. The sidewall insulation film 44 is formed to have a two-layer structure of an inside sidewall insulation film 44a and an outside sidewall insulation film 44b covering the inside sidewall insulation film 44a. Here, unsimilarly to in the n-type MOS transistor 50, the gate electrode 43 is not processed in particular after pattern-formed and has a similar height to that of the sidewall insulation film 44.

In both sides of the gate electrode 43 are formed undepicted source/drain regions being a pair of p-type impurity diffusion regions made by introduction of a predetermined p-type impurity, while on an upper surface of the gate electrode 43 and on upper surfaces of the source/drain regions are each formed silicide layers 45 for lower resistance.

Further, a CESL film 36 is formed on an entire surface in a manner to cover an n-type MOS region and a p-type MOS region.

By forming the CESL film 36, in the p-type MOS transistor 60, stresses are applied in directions indicated by arrows in the drawing, and in particular a compressive stress is applied to a channel region, so that a compressive strain is introduced.

In contrast, in the n-type MOS transistor 50, as described above, due to shapes and a positional relation of the gate electrode 33 and the sidewall insulation film 34, stresses in reverse directions to those of the p-type MOS transistor 60 are applied, and to a channel region in particular, a tensile stress is applied, so that a tensile strain is introduced.

As stated above, in the present embodiments, in spite of formation of a CESL film 36 which ordinarily has a property of improving characteristics of a p-type MOS transistor and deteriorating characteristics of an n-type MOS transistor in a manner to cover both n-type MOS transistor side and p-type MOS transistor side in order to prevent an increase of the number of process steps and complication of the process, the characteristics of both the transistors are improved and a highly reliable CMOS transistor is realized.

Preferred Embodiments

Hereinafter, preferred embodiments will be described in detail with reference to the drawings.

First Embodiment

In this embodiment, a manufacturing method of a p-type MOS transistor 10 of FIG. 1 will be described.

FIG. 7A to FIG. 7C and FIG. 8A to FIG. 8C are schematic cross-sectional views illustrating a manufacturing method of a p-type MOS transistor according to a first embodiment in order of process steps.

Figure 7A:
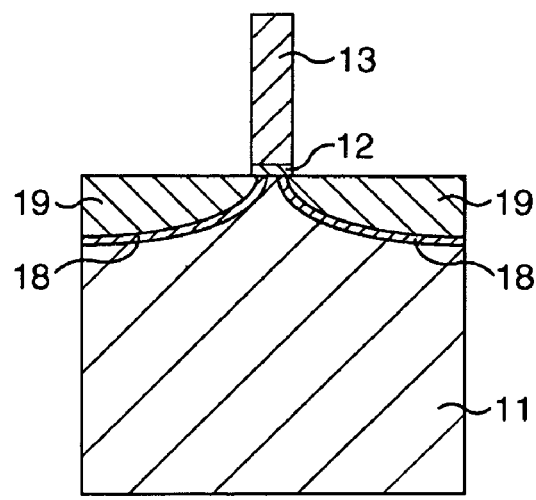
FIG. 7A is a schematic cross-sectional view illustrating a manufacturing method of a p-type MOS transistor according to a first embodiment in order of process steps.

First, as illustrated in FIG. 7A, after a gate electrode 13 is pattern-formed on a silicon semiconductor substrate 11 via a gate insulation film 12, pocket regions 18 and extension regions 19 are sequentially formed.

More detailedly, first, an SiON film (undepicted) is formed to be, for example, about 1.5 nm in film thickness on the silicon semiconductor substrate 11 by a CVD method, a thermal oxidation method, a thermal nitridation method or the like.

Next, a polycrystalline silicon film (undepicted) is deposited to be, for example, about 70 nm in film thickness on an entire surface by the CVD method or the like.

Then, the polycrystalline silicon film and the SiON film are patterned to have an electrode shape, so that the gate electrode 13 via the gate insulation film 12 is pattern-formed on the silicon semiconductor substrate 11.

Next, in order to restrain a punch-through, an n-type impurity, here, arsenic (As) is ion-implanted in a surface layer of the silicon semiconductor substrate 11 with the gate electrode 13 being a mask, under a condition of an acceleration energy of 30 keV and a dose amount of $1\times10^{13}/cm^2$. Thereby, a pair of the pocket regions 18 is formed in the surface layer of the silicon semiconductor substrate 11 in both sides of the gate electrode 13.

Next, with the gate electrode 13 being a mask, a p-type impurity, here, boron (B) is ion-implanted in the surface layer of the silicon semiconductor substrate 11 under a condition of an acceleration energy of 1 keV and a dose amount of $1\times10^{14}/cm^2$. Thereby, a pair of the extension regions 19 is formed in a manner to be overlapped with the pocket regions 18 in the surface layer of the silicon semiconductor substrate 11 in the both sides of the gate electrode 13.

Figure 7B:
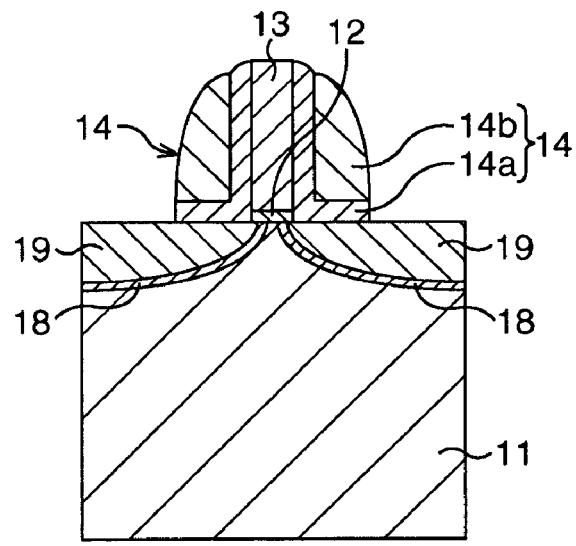
FIG. 7B is a schematic cross-sectional view, continued from FIG. 7A, illustrating the manufacturing method of the p-type MOS transistor according to the first embodiment in order of process steps.

Subsequently, as illustrated in FIG. 7B, a sidewall insulation film 14 is formed on both side surfaces of the gate electrode 13.

More detailedly, first, an insulation film, here, a silicon oxide film is deposited by the CVD method in a manner to cover the gate electrode 13. Then, an entire surface is etch-backed (overall anisotropic etching) by an RIE and the silicon oxide film is left on the both side surfaces of the gate electrode 13, so that inside sidewall insulation film 14a is formed.

Next, an insulation film of a material different from that of the inside sidewall insulation film 14a, here, a silicon nitride film is deposited by the CVD method in a manner to cover the gate electrode 13 and the inside sidewall insulation film 14a. Then, an entire surface is etch-backed by the RIE and the silicon nitride film is left in a manner to cover the inside sidewall insulation film 14a, so that outside sidewall insulation film 14b is formed. At this time, the sidewall insulation film 14 constituted with the inside sidewall insulation film 14a and the outside sidewall insulation film 14b is formed.

It should be noted that, if not particularly necessary, the sidewall insulation film 14 can be formed to have a single-layer structure.

Figure 7C:
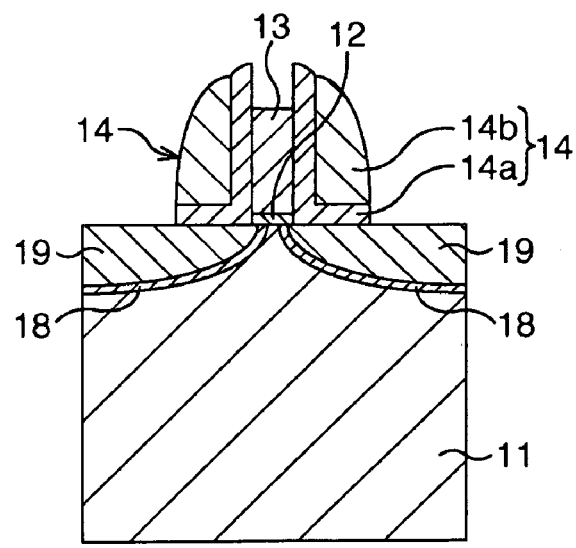
FIG. 7C is a schematic cross-sectional view, continued from FIG. 7B, illustrating the manufacturing method of the p-type MOS transistor according to the first embodiment in order of process steps.

Subsequently, as illustrated in FIG. 7C, only the gate electrode 13 is partially removed.

More detailedly, by, for example, a wet etching using TMAH, only the gate electrode 13 is etched selectively in relation to the sidewall insulation film 14. Thereby, the gate electrode 13 becomes lower by a predetermined amount, so that an upper portion of the gate electrode 13 becomes lower than an upper portion of the sidewall insulation film 14.

Figure 8A:
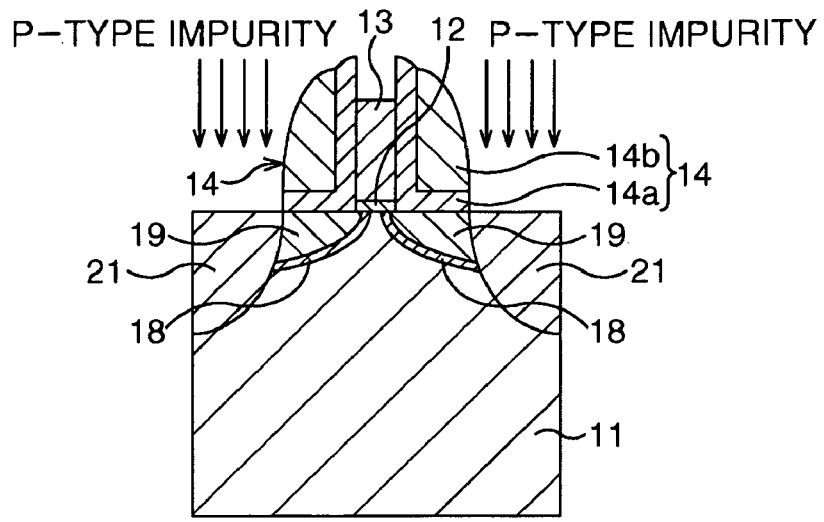
FIG. 8A is a schematic cross-sectional view, continued from FIG. 7C, illustrating the manufacturing method of the p-type MOS transistor according to the first embodiment in order of process steps.

Subsequently, as illustrated in FIG. 8A, a p-type impurity is introduced into the gate electrode 13, and source/drain regions 21 are formed.

More detailedly, with the gate electrode 13 and the sidewall insulation film 14 being a mask, a p-type impurity, here, boron (B) is ion-implanted in the surface layer of the silicon semiconductor substrate 11 under a condition of an acceleration energy of 5 keV and a dose amount of $1\times10^{15}/cm^2$. Thereby, B is introduced into the gate electrode 13, and in the surface layer of the silicon semiconductor substrate 11 in the both sides of the gate electrode 13, a pair of the source/drain regions 21 deeper than the extension regions 19 is formed in a manner to be partially overlapped with the pocket regions 18 and the pair of the extension regions 19.

Thereafter, an annealing processing is performed at 1000° C. for about one second to activate introduced various impurities.

Figure 8B:
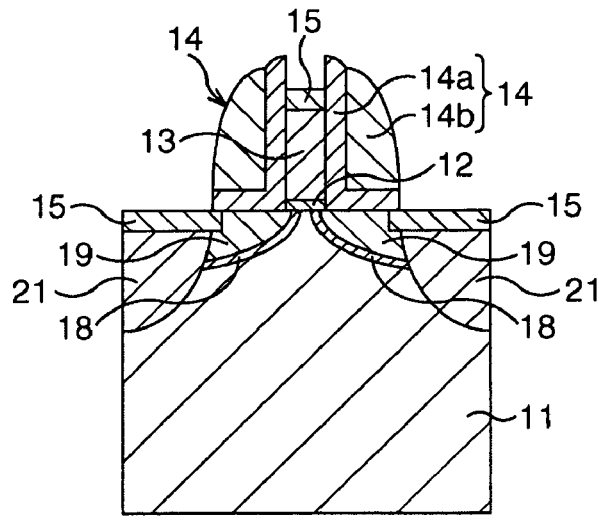
FIG. 8B is a schematic cross-sectional view, continued from FIG. 8A, illustrating the manufacturing method of the p-type MOS transistor according to the first embodiment in order of process steps.

Subsequently, as illustrated in FIG. 8B, silicide layers 15 are formed to make a salicide structure.

More detailedly, a metal (undepicted) which can be silicided with silicon, for example, Ni, Co, Ti or the like is deposited on an entire surface including on the gate electrode 13 and on the source/drain regions 21 by a sputtering method or the like. Then, by performing a thermal processing, the deposited metal and silicon on the gate electrode 13 and the source/drain regions 21 are reacted. Thereafter, the unreacted metal is removed by a wet etching. Thereby, the silicide layers 15 are each formed on the gate electrode 13 and on the source/drain regions 21, so that the salicide structure is made.

Figure 8C:
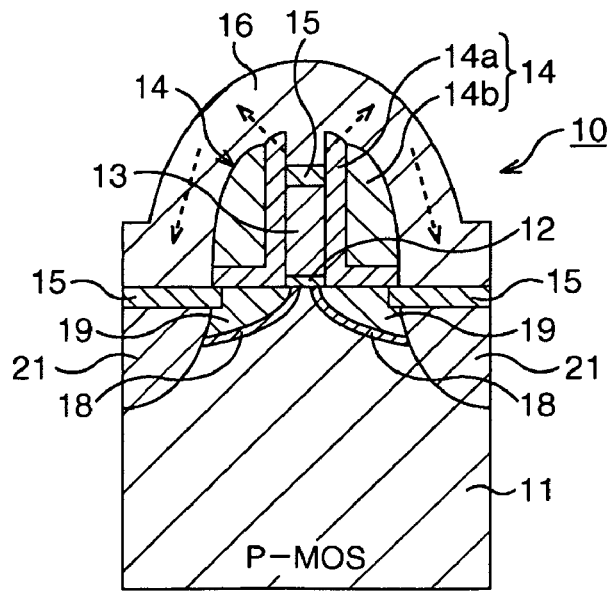
FIG. 8C is a schematic cross-sectional view, continued from FIG. 8B, illustrating the manufacturing method of the p-type MOS transistor according to the first embodiment in order of process steps.

Subsequently, as illustrated in FIG. 8C, a TESL film 16 is formed on an entire surface in a manner to cover the gate electrode 13, the sidewall insulation film 14 and the source/drain regions 21.

More detailedly, first, by using SiN film-forming gas (for example, $NH_3$, $SiH_4$ and so on), a SiN film (undepicted) is deposited to be, for example, about 40 nm in film thickness on the entire surface of the silicon semiconductor substrate 11 by a plasma CVD method. Then, hydrogen (H) is separated from inside of the formed SiN film by UV curing. Thereby, there is formed the TESL film 16 being a SiN film having a property of applying a tensile stress to the outside by contracting itself.

Thereafter, after various processes such as formation of an interlayer insulation film, formation of a contact hole with the TESL film 16 being an etching stopper and formation of a wiring, the p-type MOS transistor 10 is completed.

In this embodiment, in the p-type MOS transistor 10, in spite of formation of the TESL film 16 which ordinarily has a property of giving a channel region a strain to improve characteristics of an n-type MOS transistor and which gives the channel region a strain to deteriorate characteristics of the p-type MOS transistor, in reality, a strain to improve the characteristics of the p-type MOS transistor 10 is given to the channel region. Thereby, improvement of the characteristics of the p-type MOS transistor 10 is realized.

Second Embodiment

In this embodiment, a manufacturing method of a p-type MOS transistor 20 of FIG. 2 will be described.

FIG. 9A to FIG. 9C and FIG. 10A to FIG. 10C are schematic cross-sectional views illustrating a manufacturing method of a p-type MOS transistor according to a second embodiment in order of process steps.

Figure 9A:
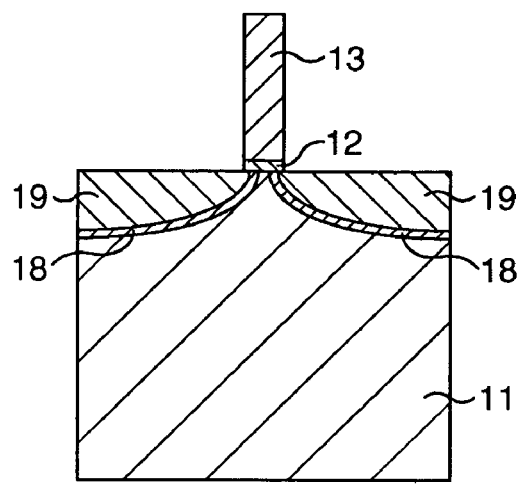
FIG. 9A is a schematic cross-sectional view illustrating a manufacturing method of a p-type MOS transistor according to a second embodiment in order of process steps.
Figure 9B:
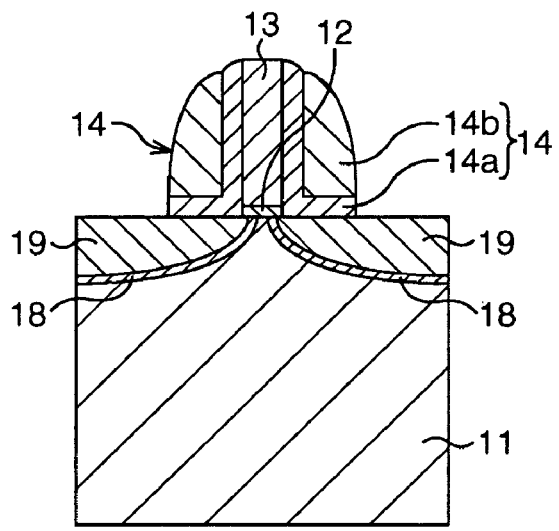
FIG. 9B is a schematic cross-sectional view, continued from FIG. 9A, illustrating the manufacturing method of the p-type MOS transistor according to the second embodiment in order of process steps.

First, in FIG. 9A and FIG. 9B, the same processes as in those in FIG. 7A to FIG. 7C in the first embodiment are performed. It should be noted that in this embodiment it is essential to form a sidewall insulation film 14 to have a two layer-structure of an inside sidewall insulation film 14a and an outside sidewall insulation film 14b.

Figure 9C:
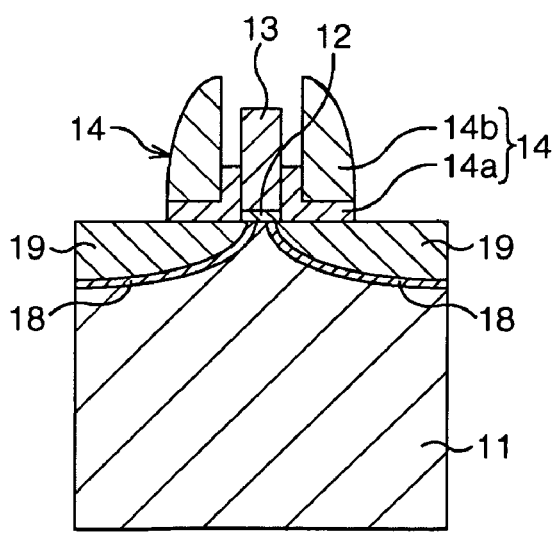
FIG. 9C is a schematic cross-sectional view, continued from FIG. 9B, illustrating the manufacturing method of the p-type MOS transistor according to the second embodiment in order of process steps.

Subsequently, as illustrated in FIG. 9C, a gate electrode 13 is partially removed and the inside sidewall insulation film 14a is partially removed.

More detailedly, first, by, for example, a wet etching using TMAH, only the gate electrode 13 is etched selectively in relation to the sidewall insulation film 14. Thereby, the gate electrode 13 becomes lower by a predetermined amount, so that an upper portion of the gate electrode 13 becomes lower than an upper portion of the sidewall insulation film 14.

Next, by, for example, the wet etching using TMAH, only the inside sidewall insulation film 14a is etched selectively in relation to the gate electrode 13 and the outside sidewall insulation film 14b. Thereby, the inside sidewall insulation film 14a becomes lower by a predetermined amount, so that an upper portion of the inside sidewall insulation film 14a becomes lower than the upper portion of the gate electrode 13.

Figure 10A:
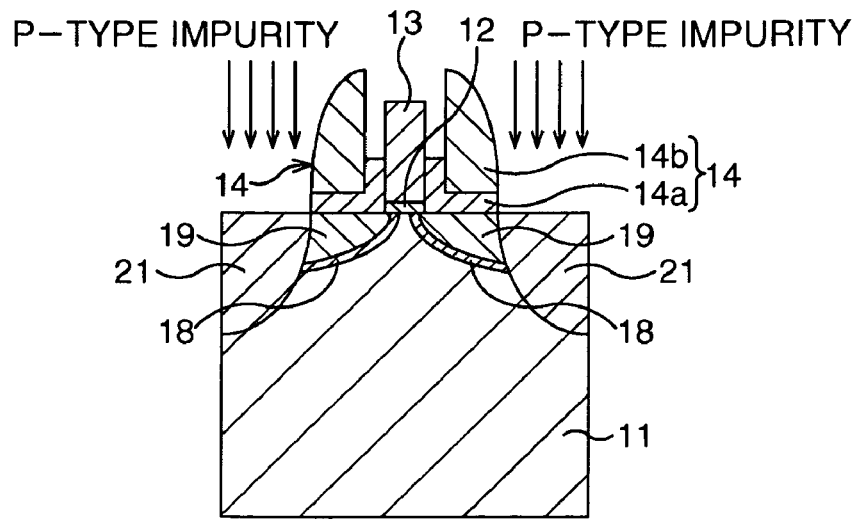
FIG. 10A is a schematic cross-sectional view, continued from FIG. 9C, illustrating the manufacturing method of the p-type MOS transistor according to the second embodiment in order of process steps.
Figure 10B:
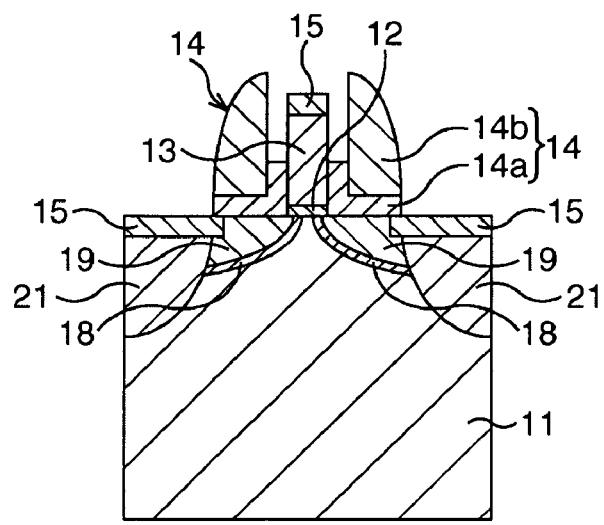
FIG. 10B is a schematic cross-sectional view, continued from FIG. 10A, illustrating the manufacturing method of the p-type MOS transistor according to the second embodiment in order of process steps.
Figure 10C:
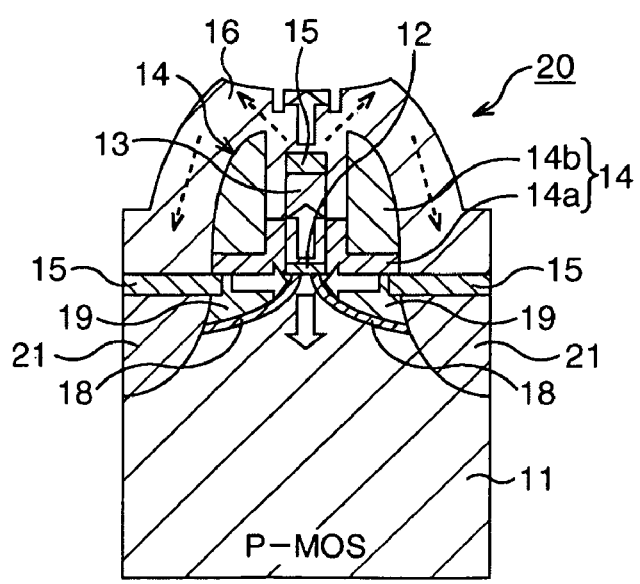
FIG. 10C is a schematic cross-sectional view, continued from FIG. 10B, illustrating the manufacturing method of the p-type MOS transistor according to the second embodiment in order of process steps.

Subsequently, in FIG. 10A to FIG. 10C, the same processes as those in FIG. 8A to FIG. 8C in the first embodiment are performed.

Thereafter, after various processes such as formation of an interlayer insulation film, formation of a contact hole with a TESL film 16 being an etching stopper and formation of a wiring, the p-type MOS transistor 20 is completed.

In this embodiment, in the p-type MOS transistor 20, in spite of formation of the TESL film 16 which ordinarily has a property of giving a channel region a strain to improve characteristics of an n-type MOS transistor and which gives the channel region a strain to deteriorate characteristics of the p-type MOS transistor, in reality, a strain to improve the characteristics of the p-type MOS transistor 20 is given to the channel region. Here, a compressive stress applied to the channel region can be controlled meticulously by controlling etching amounts of the gate electrode 13 and the sidewall insulation film 14a. Thereby, improvement of the characteristics of the p-type MOS transistor 20 is realized.

Third Embodiment

In this embodiment, a manufacturing method of an n-type MOS transistor 40 of FIG. 4 will be described.

FIG. 11A to FIG. 11C and FIG. 12A to FIG. 12C are schematic cross-sectional views illustrating a manufacturing method of an n-type MOS transistor according to a third embodiment in order of process steps.

Figure 11A:
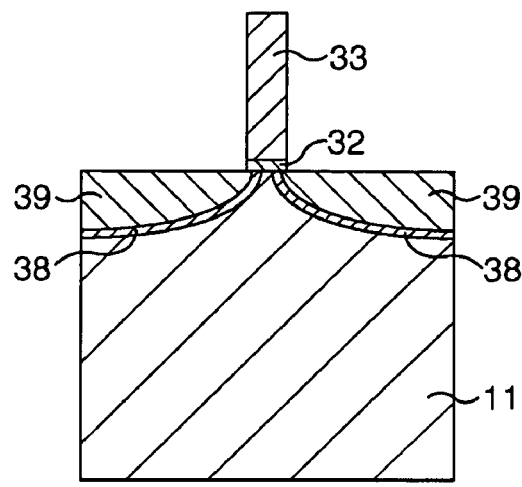
FIG. 11A is a schematic cross-sectional view illustrating a manufacturing method of an n-type MOS transistor according to a third embodiment in order of process steps.

First, as illustrated in FIG. 11A, after a gate electrode 33 is pattern-formed on a silicon semiconductor substrate 11 via a gate insulation film 12, pocket regions 38 and extension regions 39 are sequentially formed.

More detailedly, first, an SiON film (undepicted) is formed to be, for example, about 1.5 nm in film thickness on the silicon semiconductor substrate 11 by a CVD method, a thermal oxidation method, a thermal nitridation method or the like.

Next, a polycrystalline silicon film (undepicted) is deposited to be, for example, about 70 nm in film thickness on an entire surface by the CVD method.

Then, the polycrystalline silicon film and the SiON film are patterned to have an electrode shape, so that the gate electrode 33 via the gate insulation film 32 is pattern-formed on the silicon semiconductor substrate 11.

Next, in order to restrain a punch-through, a p-type impurity, here, boron (B) is ion-implanted in a surface layer of the silicon semiconductor substrate 11 with the gate electrode 33 being a mask, under a condition of an acceleration energy of 10 keV and a dose amount of $1 \times 10^{13}/cm^2$. Thereby, a pair of the pocket regions 38 are formed in the surface layer of the silicon semiconductor substrate 11 in both sides of the gate electrode 33.

Next, with the gate electrode 33 being a mask, an n-type impurity, here, arsenic (As) is ion-implanted in the surface layer of the silicon semiconductor substrate 11 under a condition of an acceleration energy of 5 keV and a dose amount of $1 \times 10^{14}/cm^2$. Thereby, a pair of the extension regions 39 is formed in a manner to be overlapped with the pocket regions 38 in the surface layer of the silicon semiconductor substrate 11 in the both sides of the gate electrode 33.

Figure 11B:
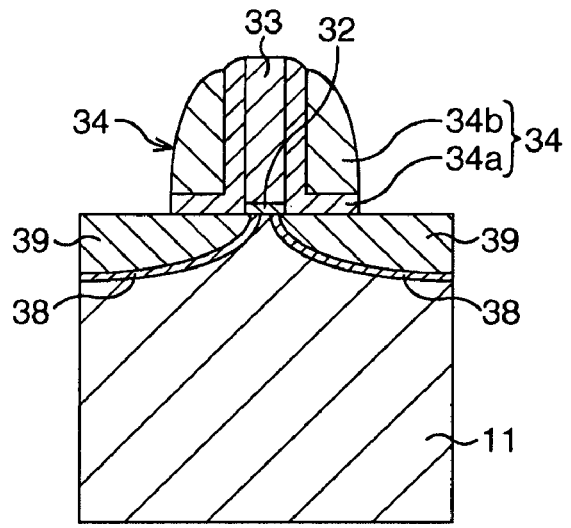
FIG. 11B is a schematic cross-sectional view, continued from FIG. 11A, illustrating the manufacturing method of the n-type MOS transistor according to the third embodiment in order of process steps.

Subsequently, as illustrated in FIG. 11B, sidewall insulation film 34 is formed on both side surfaces of the gate electrode 33.

More detailedly, first, an insulation film, here, a silicon oxide film is deposited by the CVD method in a manner to cover the gate electrode 33. Then, an entire surface is etch-backed (overall anisotropic etching) by an RIE and the silicon oxide film is left on the both side surfaces of the gate electrode 33, so that inside sidewall insulation film 34a is formed.

Next, an insulation film of a material different from that of the inside sidewall insulation film 34a, here, a silicon nitride film is deposited by the CVD method in a manner to cover the gate electrode 33 and the inside sidewall insulation film 34a. Then, an entire surface is etch-backed by the RIE and the silicon nitride film is left in a manner to cover the inside sidewall insulation film 34a, so that outside sidewall insulation film 34b is formed. At this time, the sidewall insulation film 34 constituted with the inside sidewall insulation film 34a and the outside sidewall insulation film 34b is formed.

It should be noted that, if not particularly necessary, the sidewall insulation film 34 can be formed to have a single-layer structure.

Figure 11C:
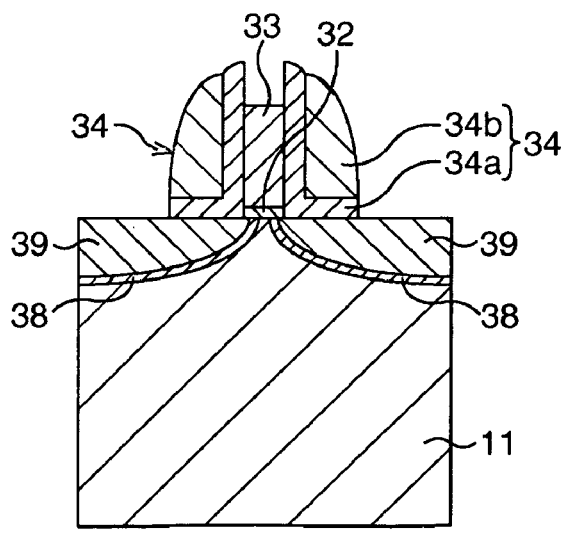
FIG. 11C is a schematic cross-sectional view, continued from FIG. 11B, illustrating the manufacturing method of the n-type MOS transistor according to the third embodiment in order of process steps.

Subsequently, as illustrated in FIG. 11C, only the gate electrode 33 is partially removed.

More detailedly, by, for example, a wet etching using TMAH, only the gate electrode 33 is etched selectively in relation to the sidewall insulation film 34. Thereby, the gate electrode 33 becomes lower by a predetermined amount, so that an upper portion of the gate electrode 33 becomes lower than an upper portion of the sidewall insulation film 34.

Figure 12A:
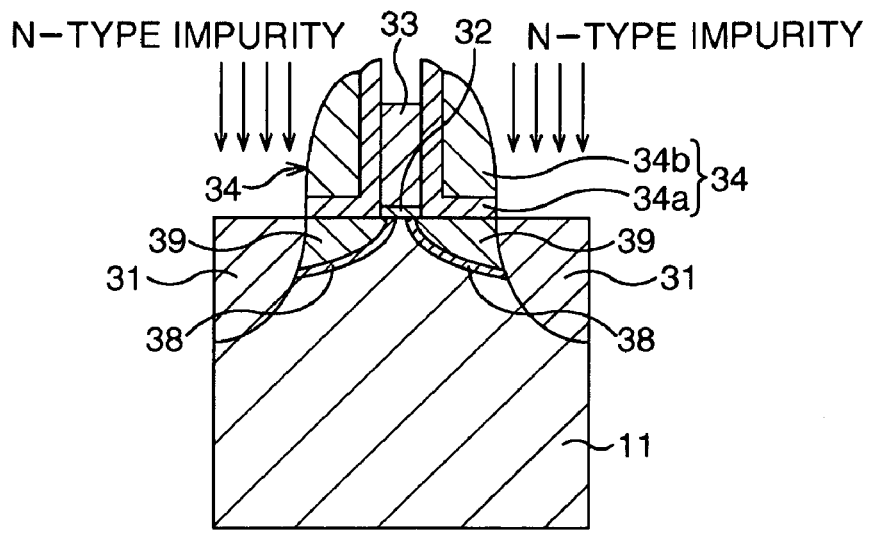
FIG. 12A is a schematic cross-sectional view, continued from FIG. 11C, illustrating the manufacturing method of the n-type MOS transistor according to the third embodiment in order of process steps.

Subsequently, as illustrated in FIG. 12A, an n-type impurity is introduced into the gate electrode 33 and source/drain regions 31 are formed.

More detailedly, with the gate electrode 33 and the sidewall insulation film 34 being a mask, an n-type impurity, here, arsenic (As) is ion-implanted in the surface layer of the silicon semiconductor substrate 11 under a condition of an acceleration energy of 30 keV and a dose amount of $1\times10^{15}/cm^2$. Thereby, As is introduced into the gate electrode 33 and, in the surface layer of the silicon semiconductor substrate 11 in the both sides of the gate electrode 33, a pair of the source/drain regions 31 deeper than the extension regions 39 are formed in a manner to be partially overlapped with the pocket regions 38 and the pair of the extension regions 39.

Thereafter, an annealing processing is performed at 1000° C. for about one second to activate introduced various impurities.

Figure 12B:
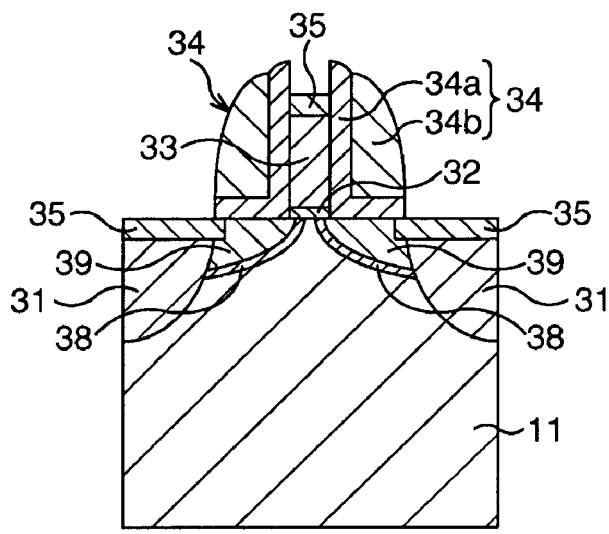
FIG. 12B is a schematic cross-sectional view, continued from FIG. 12A, illustrating the manufacturing method of the n-type MOS transistor according to the third embodiment in order of process steps.

Subsequently, as illustrated in FIG. 12B, silicide layers 35 are formed to make a salicide structure.

More detailedly, a metal (undepicted) which can be silicided with silicon, for example, Ni, Co, Ti or the like is deposited on an entire surface including on the gate electrode 33 and on the source/drain regions 31 by a sputtering method or the like. Then, by performing a thermal processing, the deposited metal and silicon on the gate electrode 33 and on the source/drain regions 31 are reacted. Thereafter, the unreacted metal is removed by a wet etching. Thereby, the silicide layers 35 are each formed on the gate electrode 33 and on the source/drain regions 31, so that the salicide structure is made.

Figure 12C:
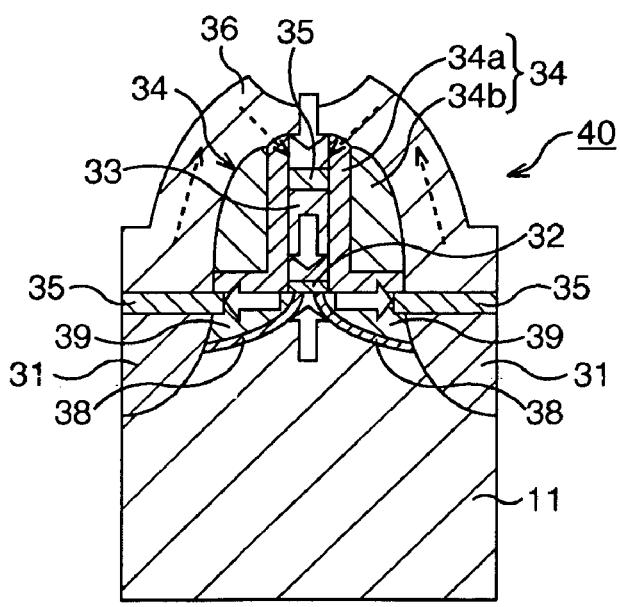
FIG. 12C is a schematic cross-sectional view, continued from FIG. 12B, illustrating the manufacturing method of the n-type MOS transistor according to the third embodiment in order of process steps.

Subsequently, as illustrated in FIG. 12C, a CESL film 36 is formed on an entire surface in a manner to cover the gate electrode 33, the sidewall insulation film 34 and the source/drain regions 31.

More detailedly, by using film-forming gas made by mixing, for example, carbon (C) into SiN film-forming gas (for example, $NH_3$, $SiH_4$ and so on), a SiN film (undepicted) is deposited to be, for example, about 40 nm in film thickness on the entire surface of the silicon semiconductor substrate 11 by a plasma CVD method. The SiN film has C mixed thereinto. Thereby, there is formed the CESL film 36 being a SiN film having a property of applying a compressive stress to the outside by expanding itself.

Thereafter, after various processes such as formation of an interlayer insulation film, formation of a contact hole with the CESL film 36 being an etching stopper and formation of a wiring, the n-type MOS transistor 40 is completed.

In this embodiment, in the n-type MOS transistor 40, in spite of formation of the CESL film 36 which ordinarily has a property of giving a channel region a strain to improve characteristics of a p-type MOS transistor and which gives the channel region a strain to deteriorate characteristics of the n-type MOS transistor, in reality, a strain to improve the characteristics of the n-type MOS transistor 40 is given to the channel region. Thereby, improvement of the characteristics of the n-type MOS transistor 40 is realized.

Fourth Embodiment

In this embodiment, a manufacturing method of an n-type MOS transistor 50 of FIG. 5 will be described.

FIG. 13A to FIG. 13C and FIG. 14A to FIG. 14C are schematic cross-sectional views illustrating a manufacturing method of an n-type MOS transistor according to a fourth embodiment in order of process steps.

Figure 13A:
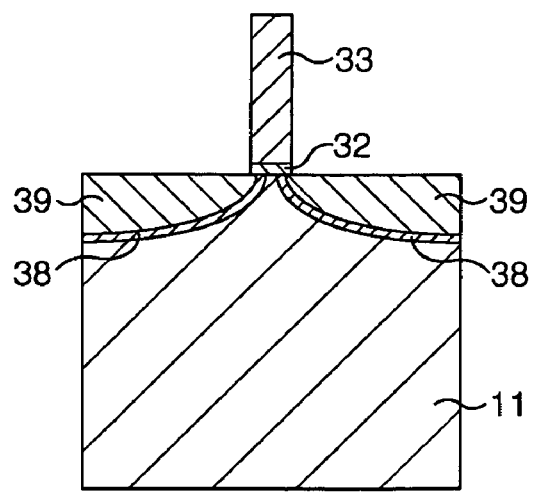
FIG. 13A is a schematic cross-sectional view illustrating a manufacturing method of an n-type MOS transistor according to a fourth embodiment in order of process steps.
Figure 13B:
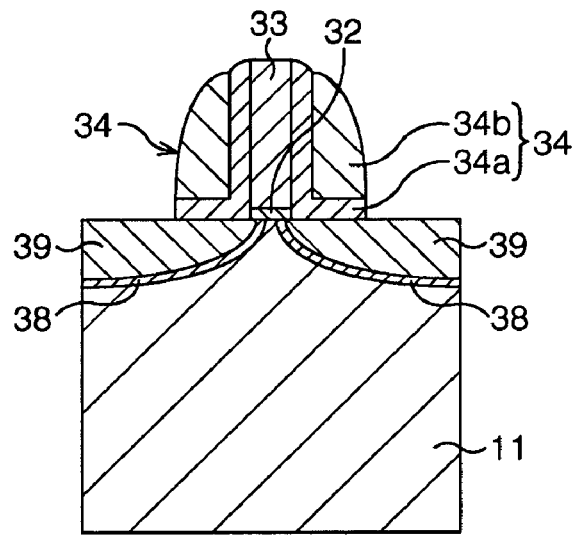
FIG. 13B is a schematic cross-sectional view, continued from FIG. 13A, illustrating the manufacturing method of the n-type MOS transistor according to the fourth embodiment in order of process steps.

First, in FIG. 13A and FIG. 13B, the same processes as in those in FIG. 11A to FIG. 1C in the third embodiment are performed. It should be noted that in this embodiment it is essential to form a sidewall insulation film 34 to have a two layer-structure of an inside sidewall insulation film 34a and an outside sidewall insulation film 34b.

Figure 13C:
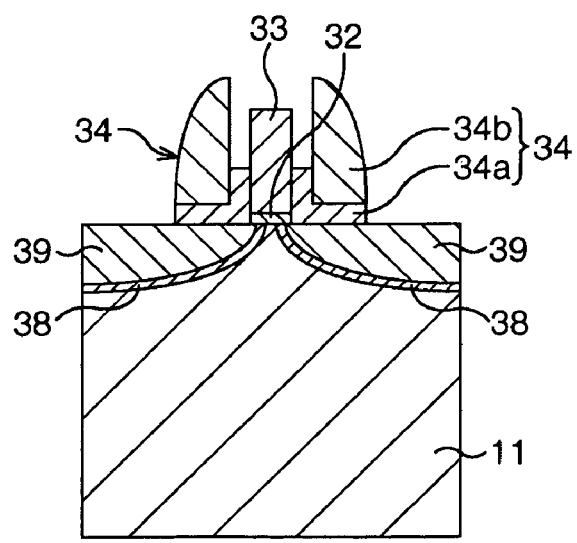
FIG. 13C is a schematic cross-sectional view, continued from FIG. 13B, illustrating the manufacturing method of the n-type MOS transistor according to the fourth embodiment in order of process steps.

Subsequently, as illustrated in FIG. 13C, a gate electrode 33 is partially removed and the inside sidewall insulation film 34a is partially removed.

More detailedly, first, by, for example, a wet etching using TMAH, only the gate electrode 33 is etched selectively in relation to the sidewall insulation film 34. Thereby, the gate electrode 33 becomes lower by a predetermined amount, so that an upper portion of the gate electrode 33 becomes lower than an upper portion of the sidewall insulation film 34.

Next, by, for example, a wet etching using TMAH and hydrofluoric acid, only the inside sidewall insulation film 34a is etched selectively in relation to the gate electrode 33 and the outside sidewall insulation film 34b. Thereby, the inside sidewall insulation film 34a becomes lower by a predetermined amount, so that an upper portion of the inside sidewall insulation film 34a becomes lower than the upper portion of the gate electrode 33.

Figure 14A:
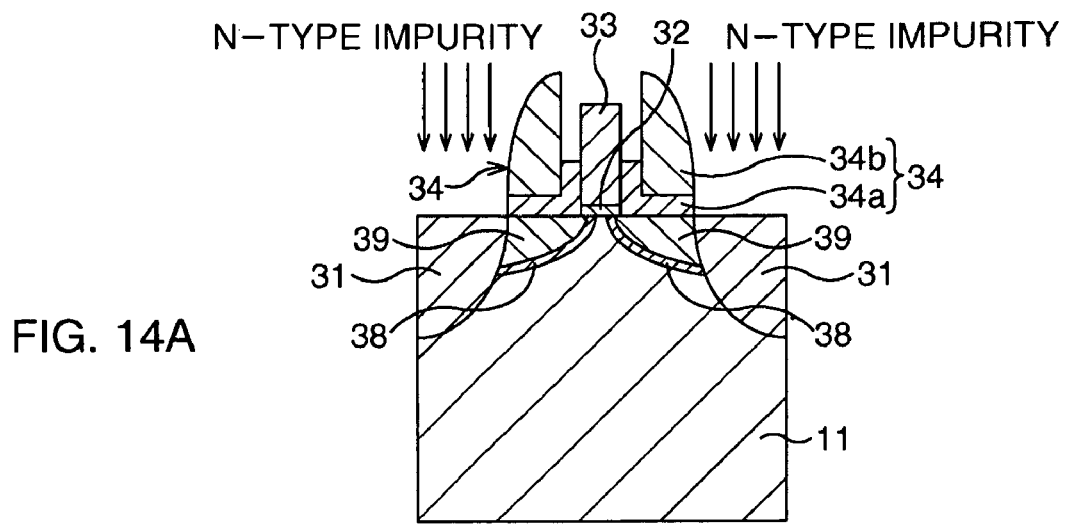
FIG. 14A is a schematic cross-sectional view, continued from FIG. 13C, illustrating the manufacturing method of the n-type MOS transistor according to the fourth embodiment in order of process steps.
Figure 14B:
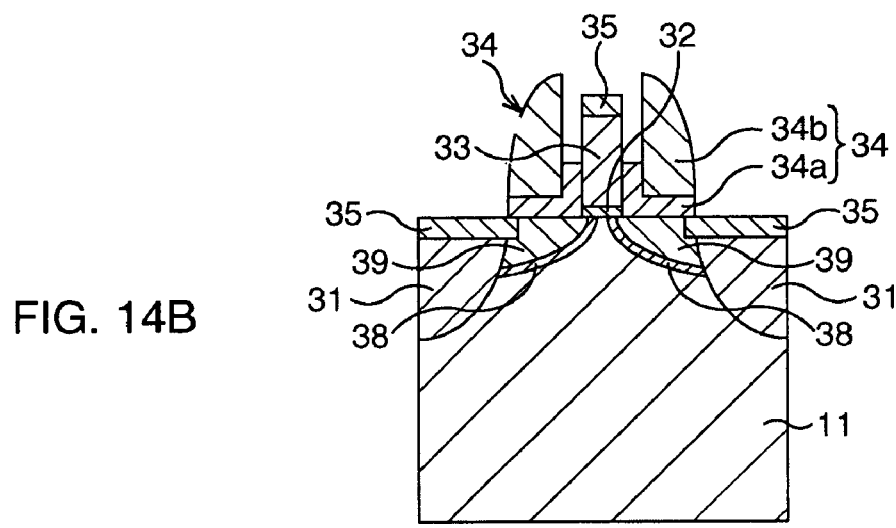
FIG. 14B is a schematic cross-sectional view, continued from FIG. 14A, illustrating the manufacturing method of the n-type MOS transistor according to the fourth embodiment in order of process steps.
Figure 14C:
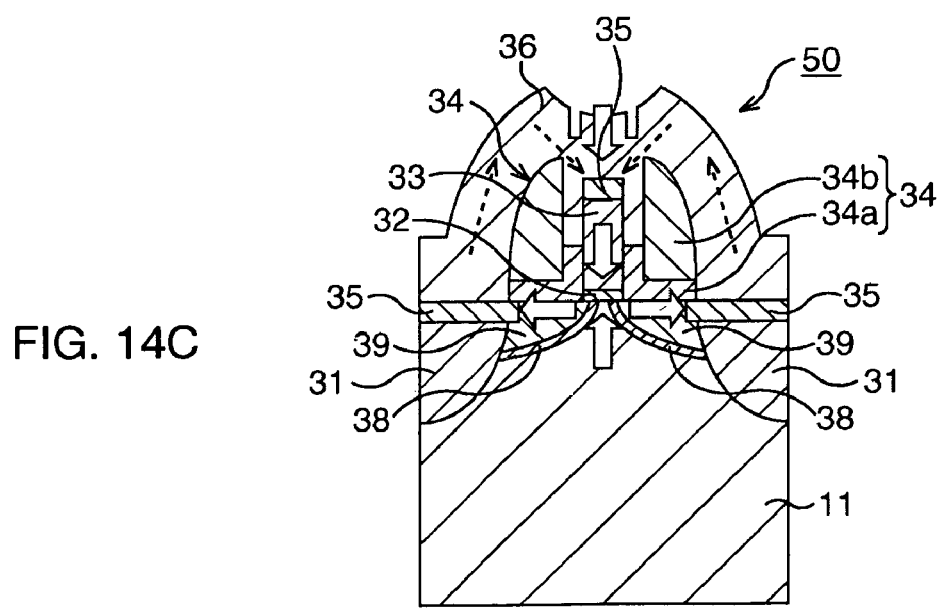
FIG. 14C is a schematic cross-sectional view, continued from FIG. 14B, illustrating the manufacturing method of the n-type MOS transistor according to the fourth embodiment in order of process steps.

Subsequently, in FIG. 14A to FIG. 14C, the same processes as those in FIG. 12A to FIG. 12C in the third embodiment are performed.

Thereafter, after various processes such as formation of an interlayer insulation film, formation of a contact hole with a CESL film 36 being an etching stopper and formation of a wiring, the n-type MOS transistor 50 is completed.

In the present embodiment, in the n-type MOS transistor 50, in spite of formation of the CESL film 36 which ordinarily has a property of giving a channel region a strain to improve characteristics of a p-type MOS transistor and which gives the channel region a strain to deteriorate characteristics of the n-type MOS transistor, in reality, a strain to improve the characteristics of the n-type MOS transistor 50 is given to the channel region. Here, a tensile stress applied to the channel region can be controlled meticulously by controlling etching amounts of the gate electrode 33 and the sidewall insulation film 34a. Thereby, improvement of the characteristics of the n-type MOS transistor 50 is realized.

Fifth Embodiment

In this embodiment, a manufacturing method of a CMOS transistor of FIG. 3 will be described.

FIG. 15 to FIG. 20 are schematic cross-sectional views illustrating a manufacturing method of a CMOS transistor according to a fifth embodiment in order of process steps.

Figure 15:
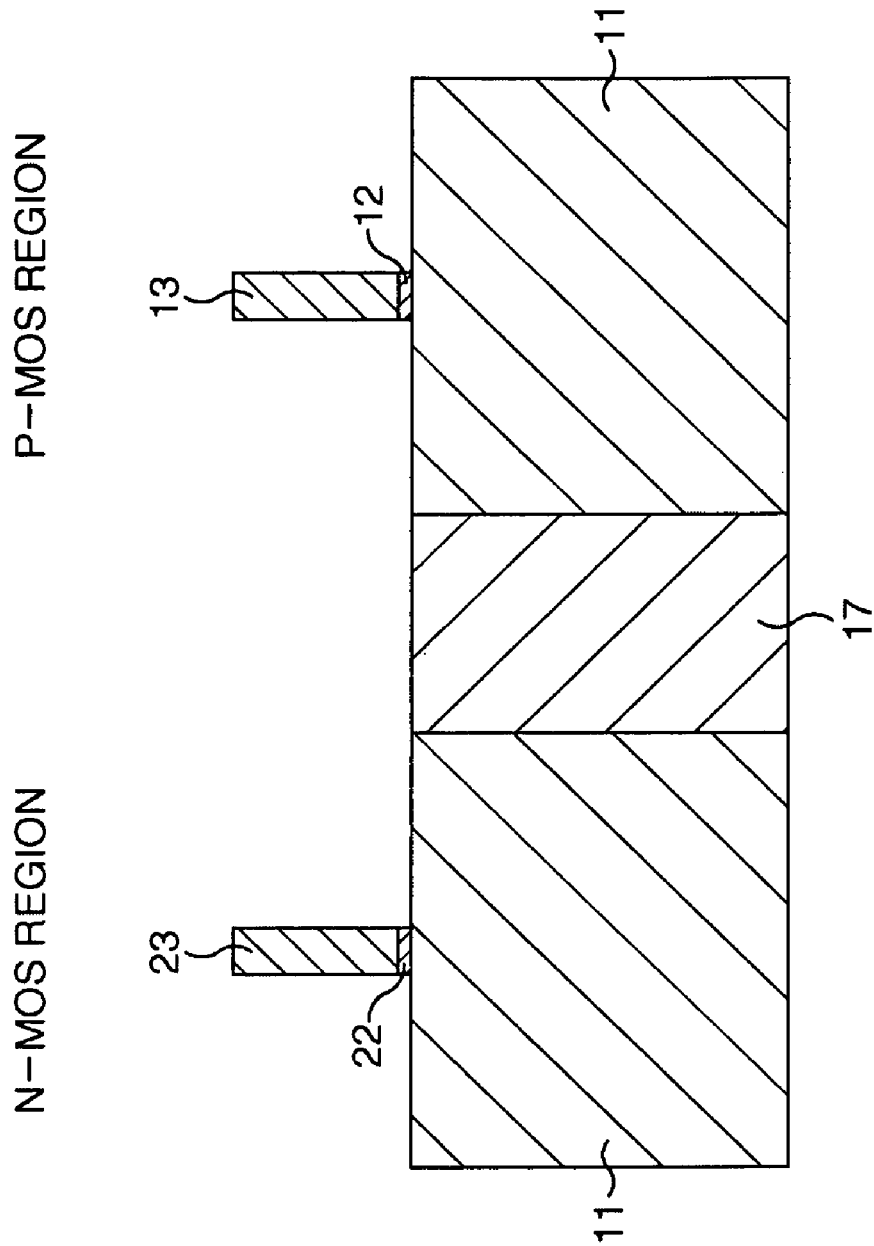
FIG. 15 is a schematic cross-sectional view illustrating a manufacturing method of a CMOS transistor according to a fifth embodiment in order of process steps.

First, as illustrated in FIG. 15, in an n-type MOS region and a p-type MOS region described by an element isolation structure 17 on a silicon semiconductor substrate 11, gate electrodes 23, 13 are pattern-formed via gate insulation films 22, 12.

More detailedly, first, the element isolation structure 17 is formed in an element isolation region in the silicon semiconductor substrate 11. Here, a trench is formed in the element isolation region by, for example, an STI (Shallow Trench Isolation) method, and the trench is filled with an insulator and planarized, whereby the element isolation structure 17 is formed. Thereby, the n-type MOS region and the p-type MOS region are defined on the silicon semiconductor substrate 11.

Next, an SiON film (undepicted) is formed to be, for example, about 1.5 nm in film thickness in the n-type MOS region and the p-type MOS region on the silicon semiconductor substrate 11 by a CVD method, a thermal oxidation method, a thermal nitridation method or the like.

Next, a polycrystalline silicon film (undepicted) is deposited to be, for example, about 70 nm in film thickness on an entire surface including the n-type MOS region and the p-type MOS region by the CVD method or the like.

Then, in the n-type MOS region and the p-type MOS region, the polycrystalline silicon film and the SiON film are simultaneously patterned to have electrode shapes. As a result, in the n-type MOS region, the gate electrode 23 via the gate insulation film 22 is pattern-formed on the silicon semiconductor substrate 11. On the other hand, in the p-type MOS region, the gate electrode 13 via the gate insulation film 12 is pattern-formed on the silicon semiconductor substrate 11.

Figure 16:
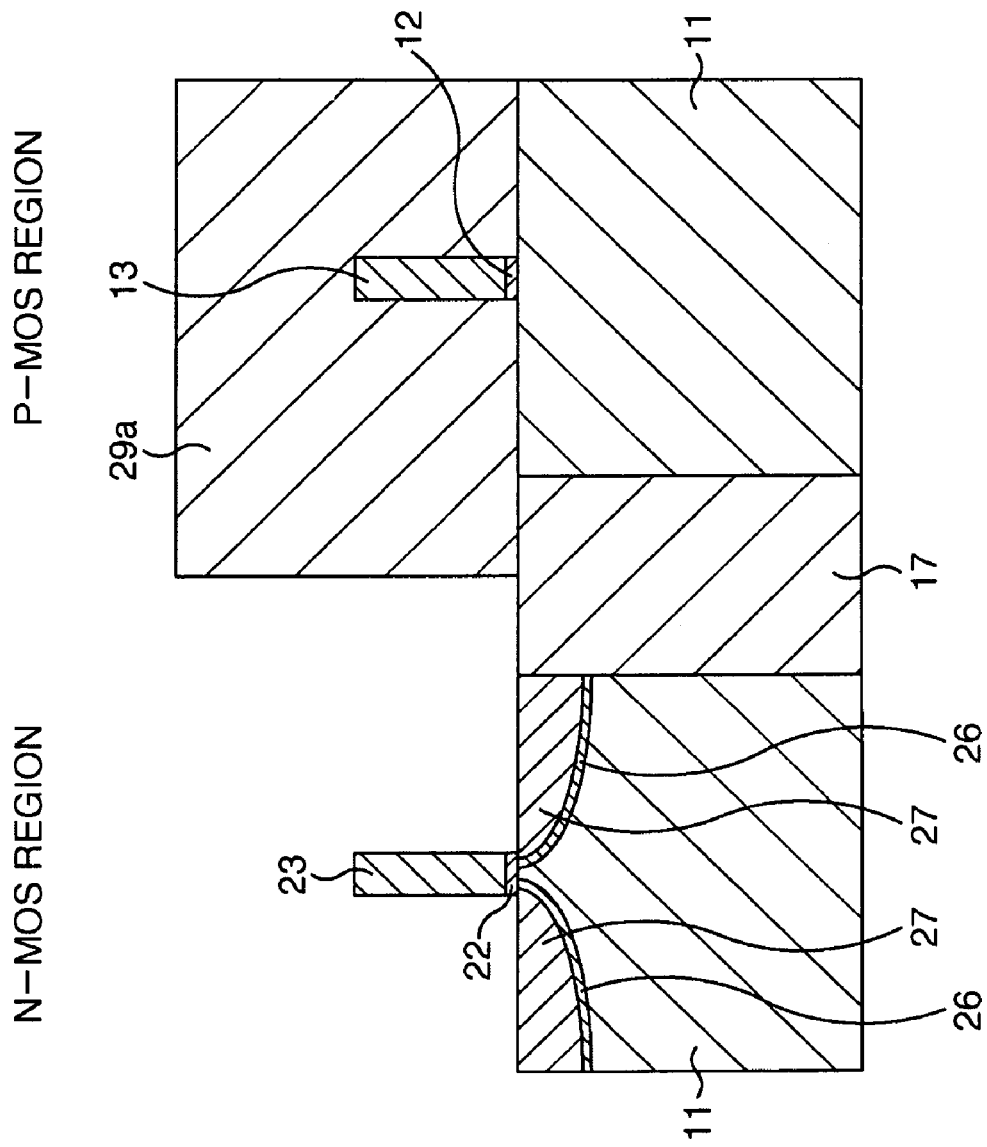
FIG. 16 is a schematic cross-sectional view, continued from FIG. 15, illustrating the manufacturing method of the CMOS transistor according to the fifth embodiment in order of process steps.

Subsequently, as illustrated in FIG. 16, pocket regions 26 and extension regions 27 are sequentially formed in the n-type MOS region.

More detailedly, first, a resist mask 29a covering the p-type MOS region and exposing the n-type MOS region is formed by lithography.

Next, as for the n-type MOS region exposed from the resist mask 29a, in order to restrain a punch-through, a p-type impurity, here, boron (B) is ion-implanted in a surface layer of the silicon semiconductor substrate 11 under a condition of an acceleration energy of 10 keV and a dose amount of $1\times10^{13}/cm^2$, with the gate electrode 23 being a mask. Thereby, a pair of the pocket regions 26 is formed in the surface layer of the silicon semiconductor substrate 11 in both sides of the gate electrode 23.

Next, with the gate electrode 23 being a mask, an n-type impurity, here, arsenic (As) is ion-implanted in the surface layer of the silicon semiconductor substrate 11 under a condition of an acceleration energy of 5 keV and a dose amount of $1\times10^{14}/cm^2$. Thereby, a pair of the extension regions 27 is formed in a manner to be overlapped with the pocket regions 26 in the surface layer of the silicon semiconductor substrate 11 in the both sides of the gate electrode 23.

Figure 17:
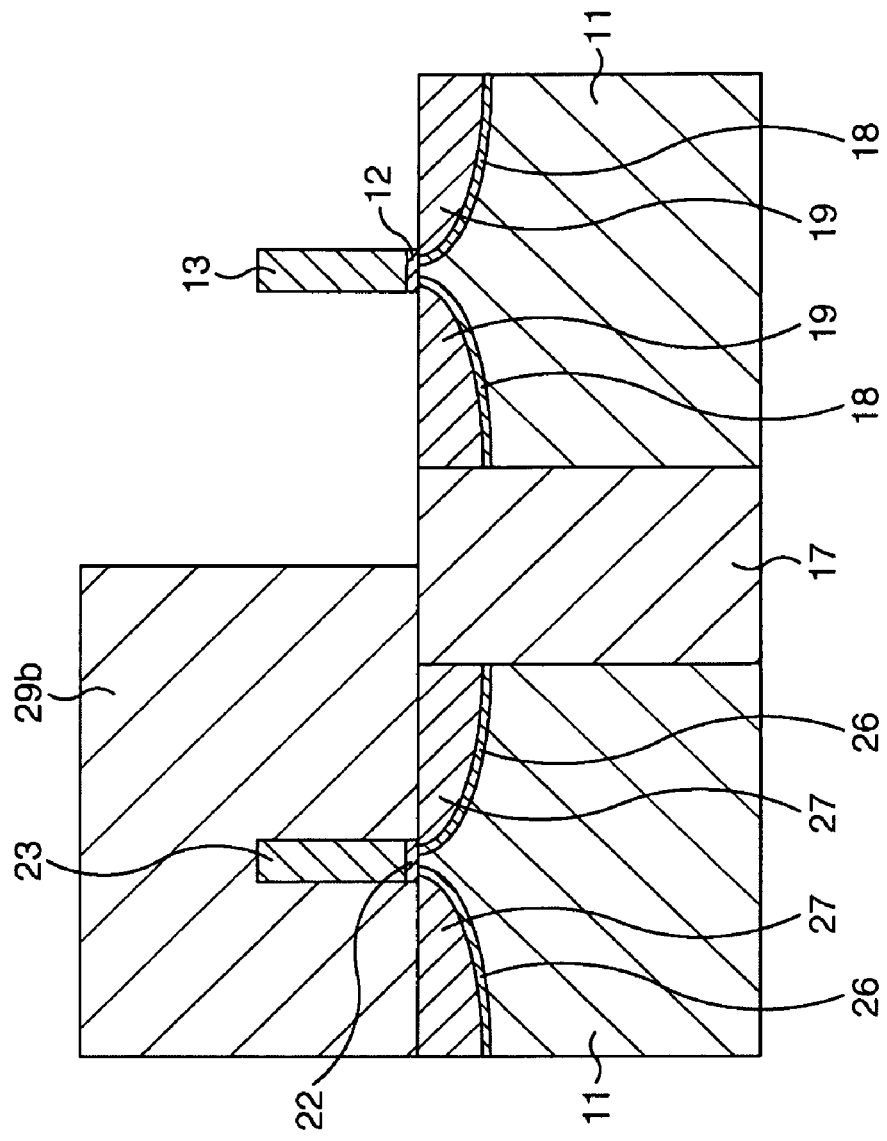
FIG. 17 is a schematic cross-sectional view, continued from FIG. 16, illustrating the manufacturing method of the CMOS transistor according to the fifth embodiment in order of process steps.

Subsequently, as illustrated in FIG. 17, pocket regions 18 and extension regions 19 are sequentially formed in the p-type MOS region.

More detailedly, first, after the resist mask 29a is removed by an ashing processing or the like, a resist mask 29b covering the n-type MOS region and exposing the p-type MOS region is formed by lithography.

Next, as for the p-type MOS region exposed from the resist mask 29b, in order to restrain a punch-through, an n-type impurity, here, arsenic (As) is ion-implanted in the surface layer of the silicon semiconductor substrate 11 under a condition of an acceleration energy of 30 keV and a dose amount of $1\times10^{13}/cm^2$, with the gate electrode 13 being a mask. Thereby, a pair of the pocket regions 18 is formed in the surface layer of the silicon semiconductor substrate 11 in both sides of the gate electrode 13.

Next, with the gate electrode 13 being a mask, a p-type impurity, here, boron (B) is ion-implanted in the surface layer of the silicon semiconductor substrate 11 under a condition of an acceleration energy of 1 keV and a dose amount of $1\times10^{14}/cm^2$. Thereby, a pair of the extension regions 19 is formed in a manner to be overlapped with the pocket regions 18 in the surface layer of the silicon semiconductor substrate 11 in the both sides of the gate electrode 13.

Figure 18:
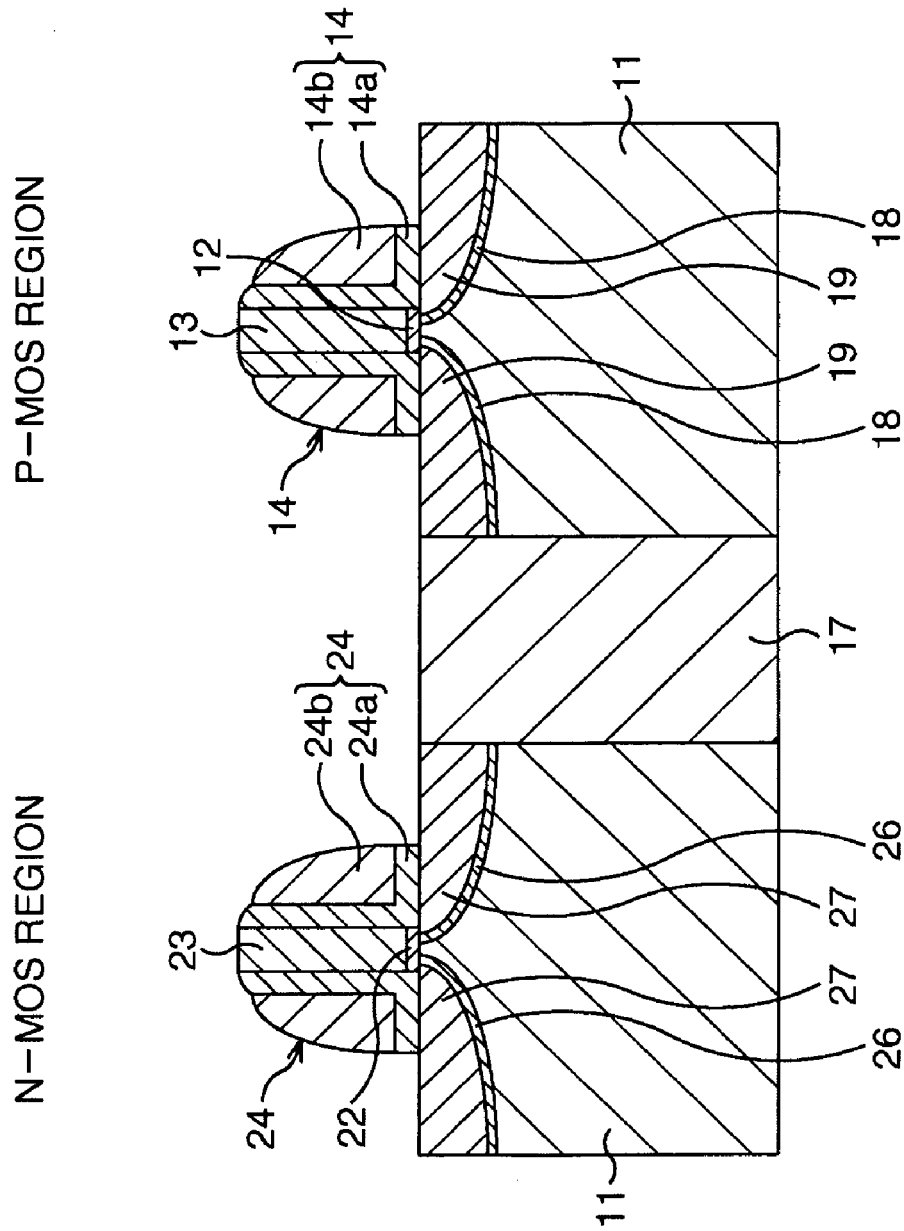
FIG. 18 is a schematic cross-sectional view, continued from FIG. 17, illustrating the manufacturing method of the CMOS transistor according to the fifth embodiment in order of process steps.

Subsequently, as illustrated in FIG. 18, a sidewall insulation film 24 is formed in the n-type MOS region and a sidewall insulation film 14 is formed in the p-type MOS region at the same time.

More detailedly, first, the resist mask 29b is removed by the ashing processing or the like.

Next, an insulation film, here, a silicon oxide film is deposited on an entire surface including the n-type MOS region and the p-type MOS region by the CVD method, in a manner to cover the gate electrodes 23, 13. Then, an entire surface is etch-backed (overall anisotropic etching) by an RIE and the silicon oxide film is left on both side surfaces of the gate electrodes 23, 13, so that inside sidewall insulation films 24a, 14a are formed.

Next, an insulation film of a material different from that of the inside sidewall insulation films 24a, 14a, here, a silicon nitride film is deposited on an entire surface including the n-type MOS region and the p-type MOS region by the CVD method, in a manner to cover the gate electrodes 23, 13 and the inside sidewall insulation films 24a, 14a. Then, an entire surface is etch-backed by the RIE and the silicon nitride film is left in a manner to cover the inside sidewall insulation films 24a, 14a, so that outside sidewall insulation films 24b, 14b are formed. At this time, the sidewall insulation film 24 constituted with the inside sidewall insulation film 24a and the outside sidewall insulation film 24b is formed in the n-type MOS region, and at the same time, the sidewall insulation film 14 constituted with the inside sidewall insulation film 14a and the outside sidewall insulation film 14b is formed in the p-type MOS region.

Figure 19:
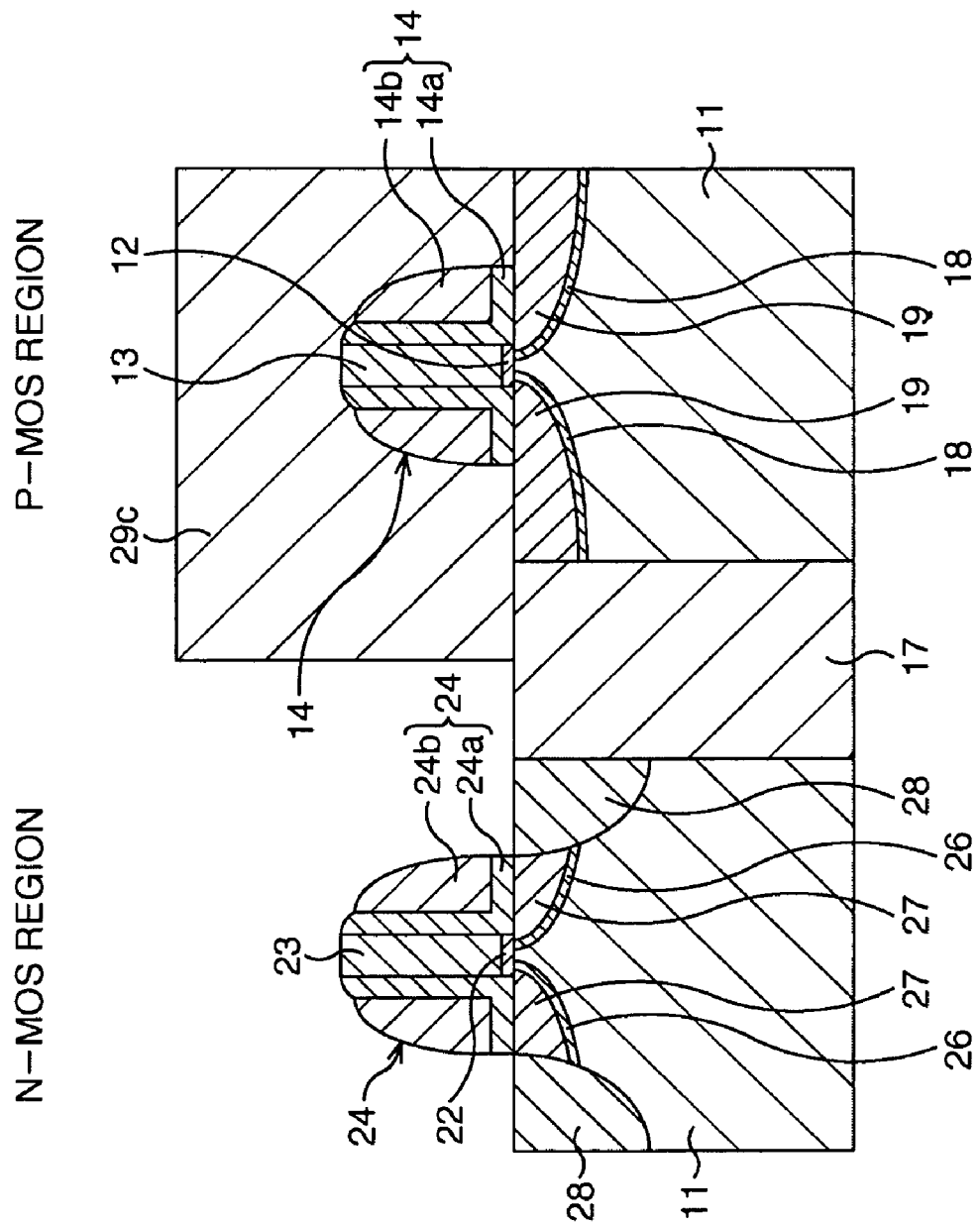
FIG. 19 is a schematic cross-sectional view, continued from FIG. 18, illustrating the manufacturing method of the CMOS transistor according to the fifth embodiment in order of process steps.

Subsequently, as illustrated in FIG. 19, a pair of source/drain regions 28 is formed in the n-type MOS region.

More detailedly, first, a resist mask 29c covering the p-type MOS region and exposing the n-type MOS region is formed by lithography.

Next, with the gate electrode 23 and the sidewall insulation film 24 being a mask, an n-type impurity, here, arsenic (As) is ion-implanted in the surface layer of the silicon semiconductor substrate 11 under a condition of an acceleration energy of 30 keV and a dose amount of $1\times10^{15}/cm^2$. Thereby, As is introduced into the gate electrode 23 and a pair of the source/drain regions 28 deeper than the extension regions 27 is formed in a manner to be partially overlapped with the pocket regions 26 and the pair of the extension regions 27, in the surface layer of the silicon semiconductor substrate 11 in the both sides of the gate electrode 23.

Figure 20:
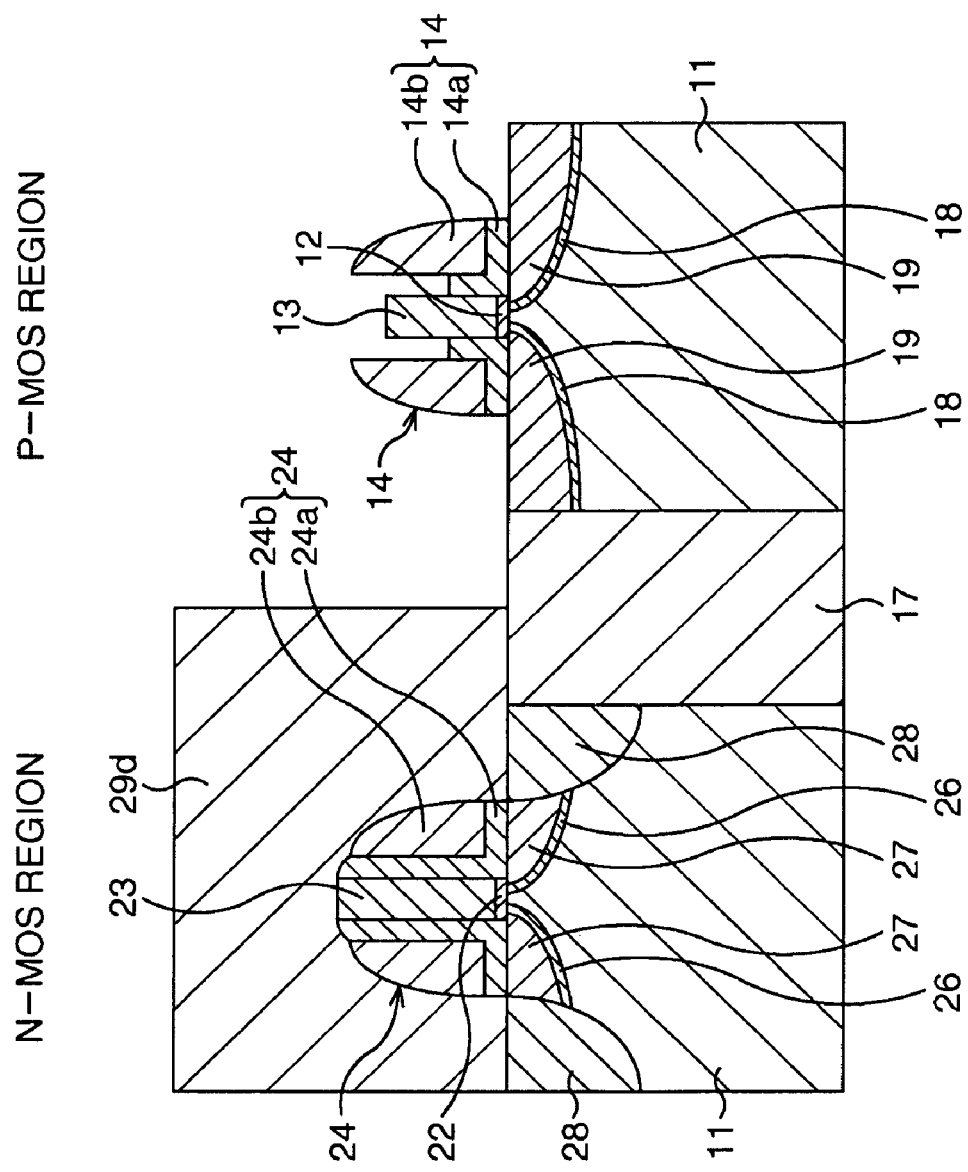
FIG. 20 is a schematic cross-sectional view, continued from FIG. 19, illustrating the manufacturing method of the CMOS transistor according to the fifth embodiment in order of process steps.

Subsequently, as illustrated in FIG. 20, in the p-type MOS region, the gate electrode 13 and the inside sidewall insulation film 14a are partially processed.

More detailedly, first, after the resist mask 29c is removed by the ashing processing or the like, a resist mask 29d covering the n-type MOS region and exposing the p-type MOS region is formed by lithography.

Next, only the gate electrode 13 is etched selectively in relation to the sidewall insulation film 14, by, for example, a wet etching using TMAH. Thereby, the gate electrode 13 becomes lower by a predetermined amount, so that an upper portion of the gate electrode 13 becomes lower than an upper portion of the sidewall insulation film 14.

Next, only the inside sidewall insulation film 14a is etched selectively in relation to the gate electrode 13 and the outside sidewall insulation film 14b by, for example, a wet etching using TMAH and hydrofluoric acid. Thereby, the inside sidewall insulation film 14a becomes lower by a predetermined amount, so an upper portion of the inside sidewall insulation film 14a becomes lower than the upper portion of the gate electrode 13.

Figure 21:
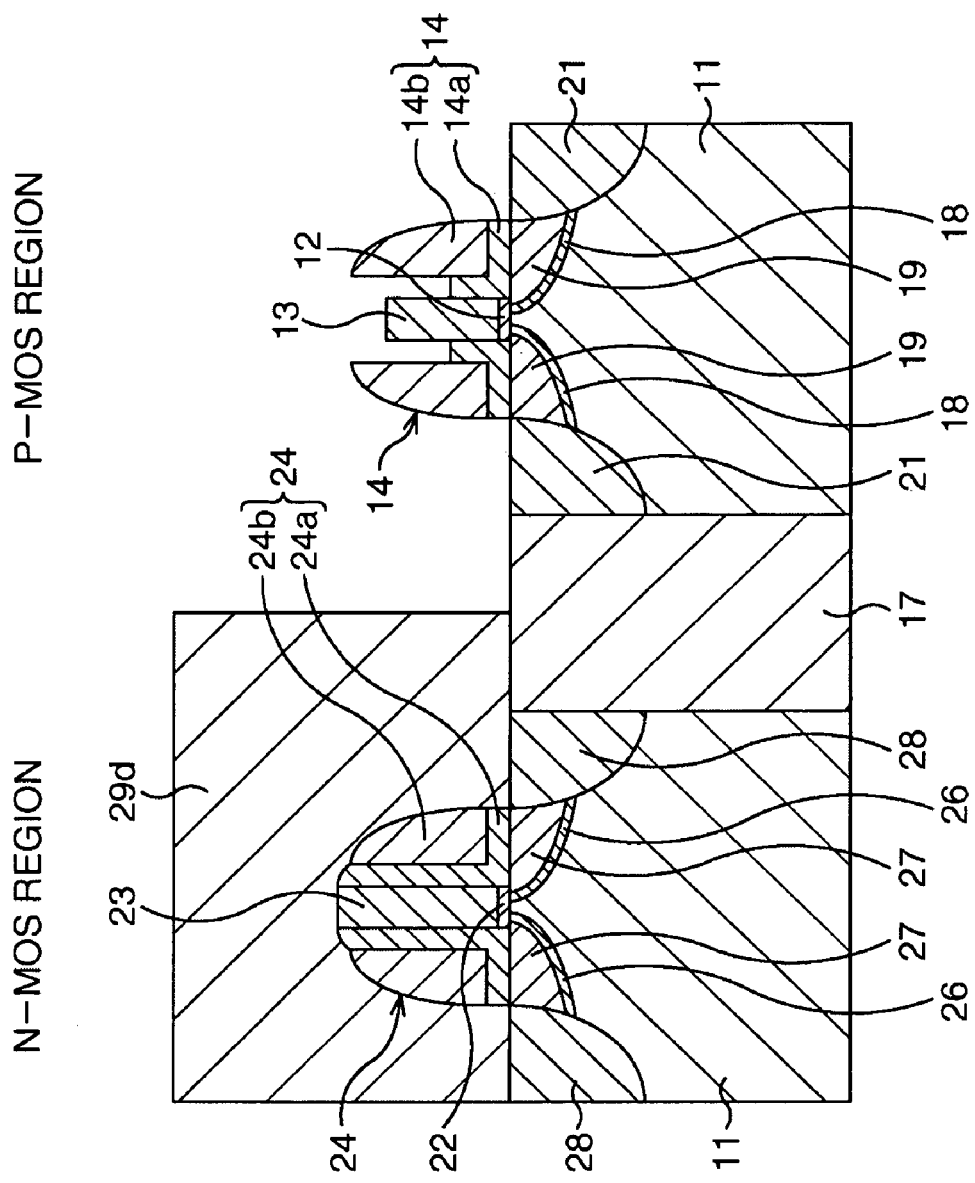
FIG. 21 is a schematic cross-sectional view, continued from FIG. 20, illustrating the manufacturing method of the CMOS transistor according to the fifth embodiment in order of process steps.

Subsequently, as illustrated in FIG. 21, source/drain regions 21 are formed in the p-type MOS region.

More detailedly, the resist mask 29d is continued to be used, and with the gate electrode 13 and the sidewall insulation film 14 being a mask, a p-type impurity, here, boron (B) is ion-implanted in the surface layer of the silicon semiconductor substrate 11 under a condition of an acceleration energy of 5 keV and a dose amount of $1 \times 10^{15}/cm^2$. Thereby, B is introduced into the gate electrode 13, and in the surface layer of the silicon semiconductor substrate 11 in the both sides of the gate electrode 13, a pair of the source/drain regions 21 deeper than the extension regions 19 is formed in a manner to be partially overlapped with the pocket regions 18 and the pair of the extension regions 19.

Then, after the resist mask 29d is removed by the ashing processing or the like, an annealing processing is performed at 1000° C. for about one second to activate various impurities introduced into the n-type MOS region and the p-type MOS region.

Figure 22:
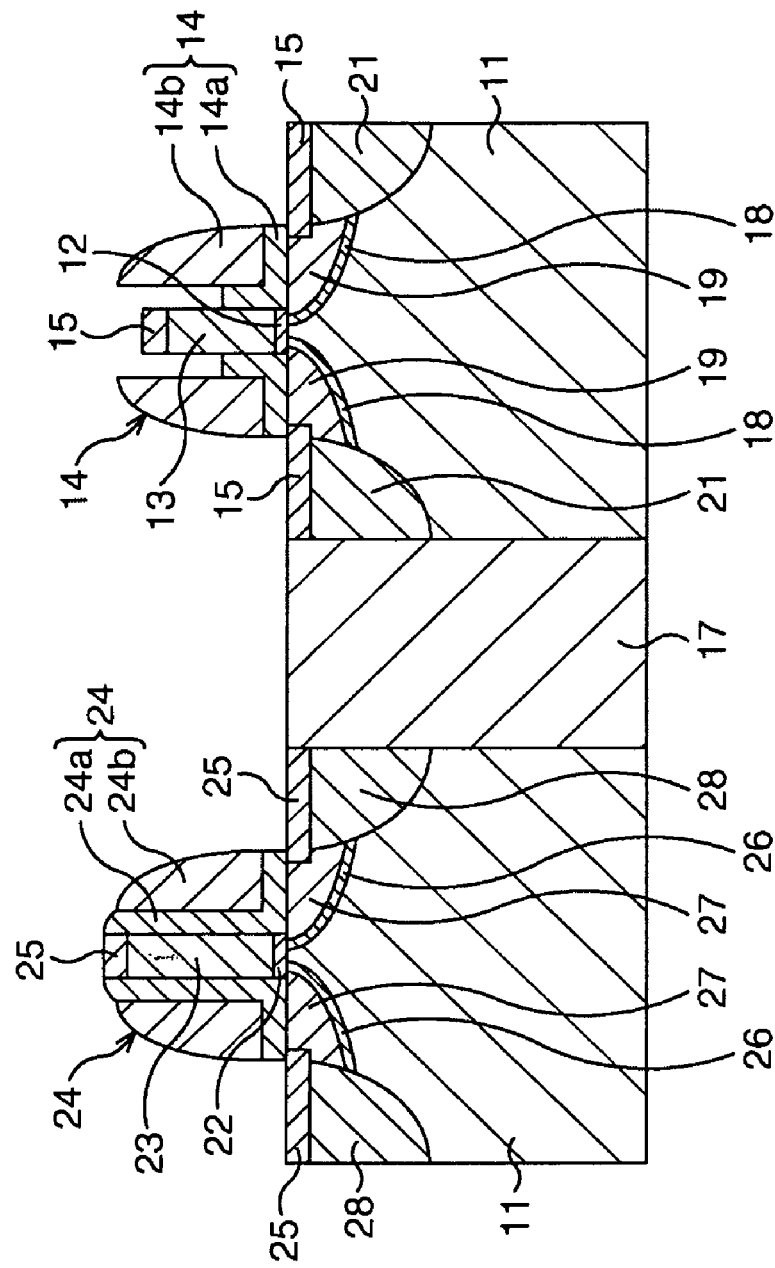
FIG. 22 is a schematic cross-sectional view, continued from FIG. 21, illustrating the manufacturing method of the CMOS transistor according to the fifth embodiment in order of process steps.

Subsequently, as illustrated in FIG. 22, silicide layers 25, 15 are formed in the n-type MOS region and the p-type MOS region to make salicide structures.

More detailedly, a metal (undepicted) which can be silicided with silicon, for example, Ni, Co, Ti or the like is deposited on an entire surface including on the gate electrodes 23, 13 and on the source/drain regions 28, 21 by a sputtering method or the like. Then, by performing a thermal processing, the deposited metal and silicon on the gate electrodes 23, 13 and the source/drain regions 28, 21 are reacted. Thereafter, the unreacted metal is removed by a wet etching. Thereby, the silicide layers 25, 15 are each formed on the gate electrodes 23, 13 and on the source/drain regions 28, 21, so that the salicide structures are made in both the n-type MOS region and the p-type MOS region.

Figure 23:
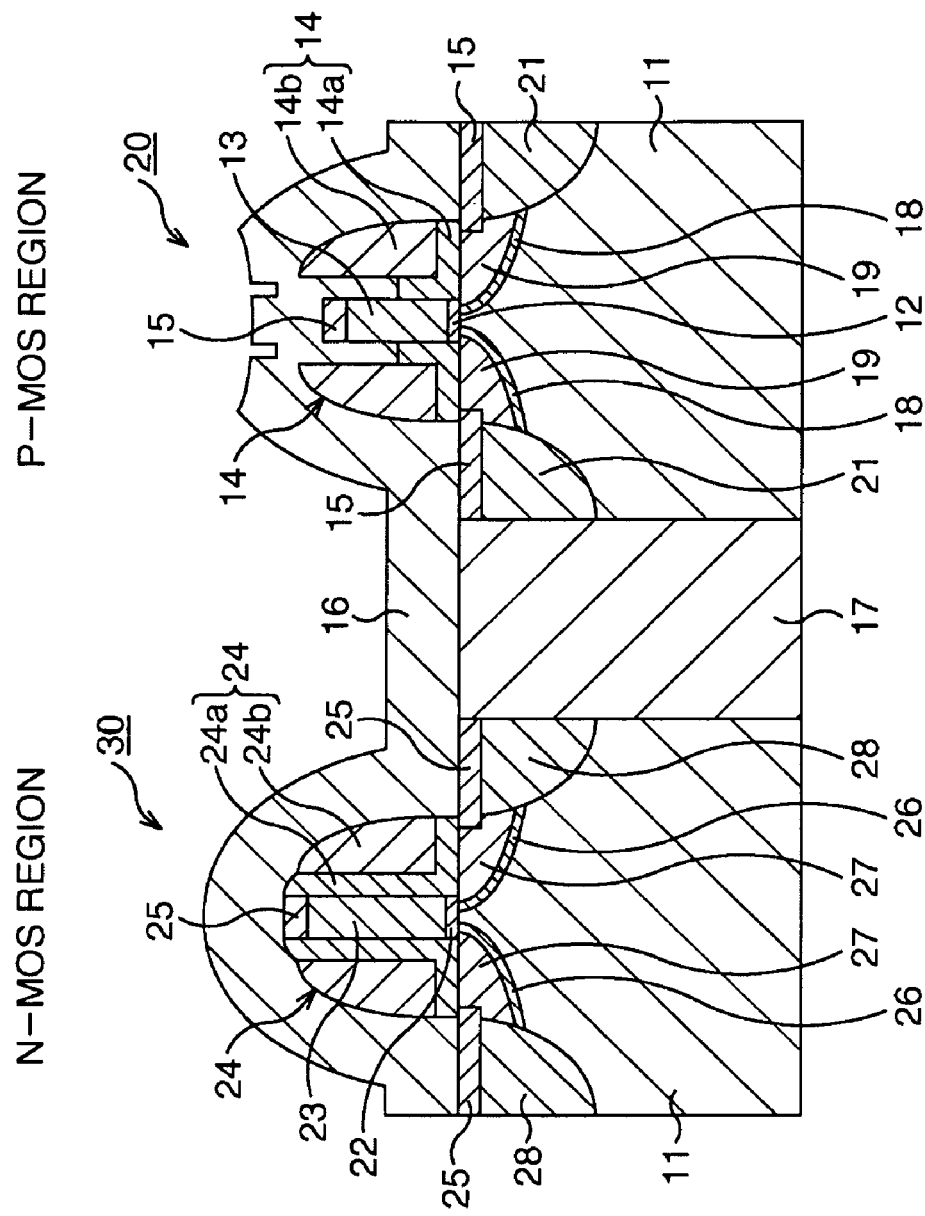
FIG. 23 is a schematic cross-sectional view, continued from FIG. 22, illustrating the manufacturing method of the CMOS transistor according to the fifth embodiment in order of process steps.

Subsequently, as illustrated in FIG. 23, a TESL film 16 is formed in a manner to cover the gate electrodes 23, 13, the sidewall insulation films 24, 14 and the source/drain regions 28, 21, on an entire surface including the n-type MOS region and the p-type MOS region.

More detailedly, first, by using SiN film-forming gas (for example, $NH_3$, $SiH_4$ and so on), a SiN film (undepicted) is deposited to be, for example, about 40 nm in film thickness on the entire surface including the n-type MOS region and the p-type MOS region by a plasma CVD method. Then, hydrogen (H) is separated from inside of the formed SiN film by UV curing. Thereby, there is formed the TESL film 16 being a SiN film having a property of applying a tensile stress to the outside by contracting itself.

Here, by the TESL film 16, in the n-type MOS region, a tensile stress is applied to a channel region and a tensile strain is introduced. On the other hand, in the p-type MOS region, due to shapes and a positional relation of the gate electrode 13 and the sidewall insulation film 14, a stress in a direction reverse to that in the n-type MOS region is applied, and a compressive stress is applied to a channel region in particular, so that a compressive strain is introduced.

Thereafter, after various processes such as formation of an interlayer insulation film, formation of a contact hole with the TESL film 16 being an etching stopper and formation of a wiring, an n-type MOS transistor 30 is formed in the n-type MOS region and a p-type MOS transistor 20 is formed in the p-type MOS region, so that a CMOS transistor is completed.

In this embodiment, though the TESL film 16 is formed in order to prevent an increase of process steps and complication of the process, in a manner to cover both the n-type MOS region and the p-type MOS region, the TESL film 16 ordinarily having a property of improving characteristics of an n-type MOS transistor and deteriorating characteristics of a p-type MOS transistor, transistor characteristics of both the n-type MOS transistor 30 and the p-type MOS transistor 20 are improved concurrently, so that a highly reliable CMOS transistor is realized.

It should be noted that though the manufacturing method of the CMOS transistor of FIG. 3 is described in this embodiment, the present embodiments can be applied to a case that the p-type MOS transistor 10 in FIG. 1 is applied to a CMOS transistor to manufacture the CMOS transistor.

Sixth Embodiment

In this embodiment, a manufacturing method of a CMOS transistor of FIG. 6 will be described.

FIG. 24 to FIG. 32 are schematic cross-sectional views illustrating a manufacturing method of a CMOS transistor according to a sixth embodiment in order of process steps.

Figure 24:
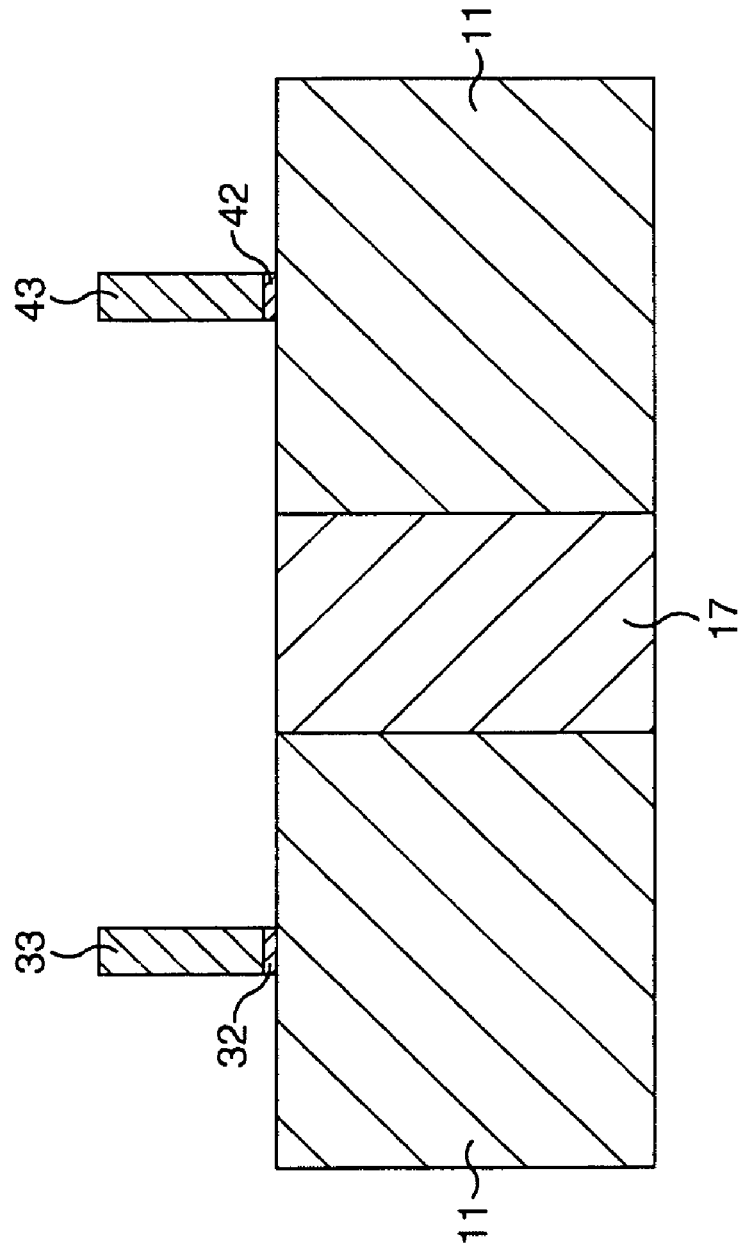
FIG. 24 is a schematic cross-sectional view illustrating a manufacturing method of a CMOS transistor according to a sixth embodiment in order of process steps.

First, as illustrated in FIG. 24, in an n-type MOS region and a p-type MOS region described by an element isolation structure 17 on a silicon semiconductor substrate 11, gate electrodes 33, 43 are pattern-formed via gate insulation films 32, 42.

More detailedly, first, the element isolation structure 17 is formed in an element isolation region in the silicon semiconductor substrate 11. Here, a trench is formed in the element isolation region by, for example, an STI (Shallow Trench Isolation) method, and the trench is filled with an insulator and planarized, whereby the element isolation structure 17 is formed. Thereby, the n-type MOS region and the p-type MOS region are defined on the silicon semiconductor substrate 11.

Next, an SiON film (undepicted) is formed to be, for example, about 1.5 nm in film thickness in the n-type MOS region and the p-type MOS region on the silicon semiconductor substrate 11 by a CVD method, a thermal oxidation method, a thermal nitridation method or the like.

Next, a polycrystalline silicon film (undepicted) is deposited to be, for example, about 70 nm in film thickness on an entire surface including the n-type MOS region and the p-type MOS region by the CVD method or the like.

Then, in the n-type MOS region and the p-type MOS region, the polycrystalline silicon film and the SiON film are simultaneously patterned to have electrode shapes. As a result, in the n-type MOS region, the gate electrode 33 via the gate insulation film 32 is pattern-formed on the silicon semiconductor substrate 11. On the other hand, in the p-type MOS region, the gate electrode 43 via the gate insulation film 42 is pattern-formed on the silicon semiconductor substrate 11.

Figure 25:
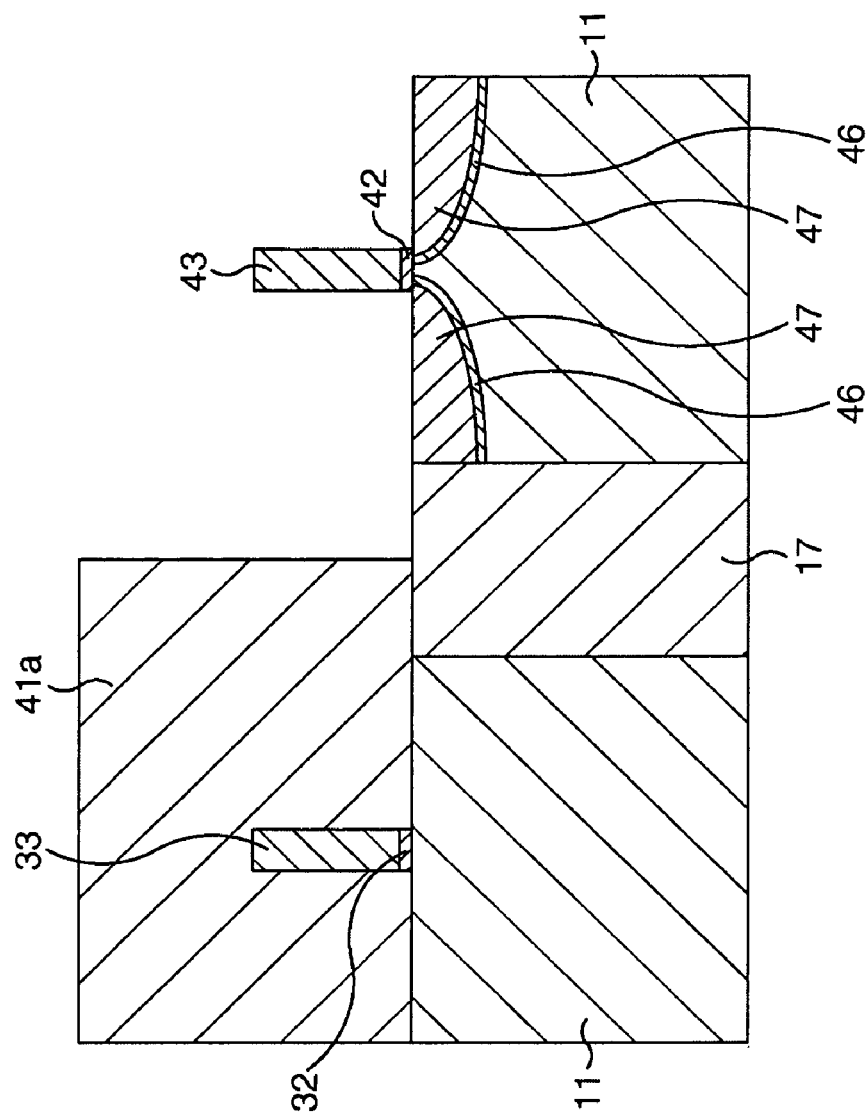
FIG. 25 is a schematic cross-sectional view, continued from FIG. 24, illustrating the manufacturing method of the CMOS transistor according to the sixth embodiment in order of process steps.

Subsequently, as illustrated in FIG. 25, pocket regions 46 and extension regions 47 are sequentially formed in the p-type MOS region.

More detailedly, first, a resist mask 41a covering the n-type MOS region and exposing the p-type MOS region is formed by lithography.

Next, as for the p-type MOS region exposed from the resist mask 41a, in order to restrain a punch-through, an n-type impurity, here, arsenic (As) is ion-implanted in a surface layer of the silicon semiconductor substrate 11 under a condition of an acceleration energy of 30 keV and a dose amount of $1 \times 10^{13}/cm^2$, with the gate electrode 43 being a mask. Thereby, a pair of the pocket regions 46 is formed in the surface layer of the silicon semiconductor substrate 11 in both sides of the gate electrode 43.

Next, with the gate electrode 43 being a mask, a p-type impurity, here, boron (B) is ion-implanted in the surface layer of the silicon semiconductor substrate 11 under a condition of an acceleration energy of 1 keV and a dose amount of $1 \times 10^{14}/cm^2$. Thereby, a pair of the extension regions 47 is formed in a manner to be overlapped with the pocket regions 46 in the surface layer of the silicon semiconductor substrate 11 in the both sides of the gate electrode 43.

Figure 26:
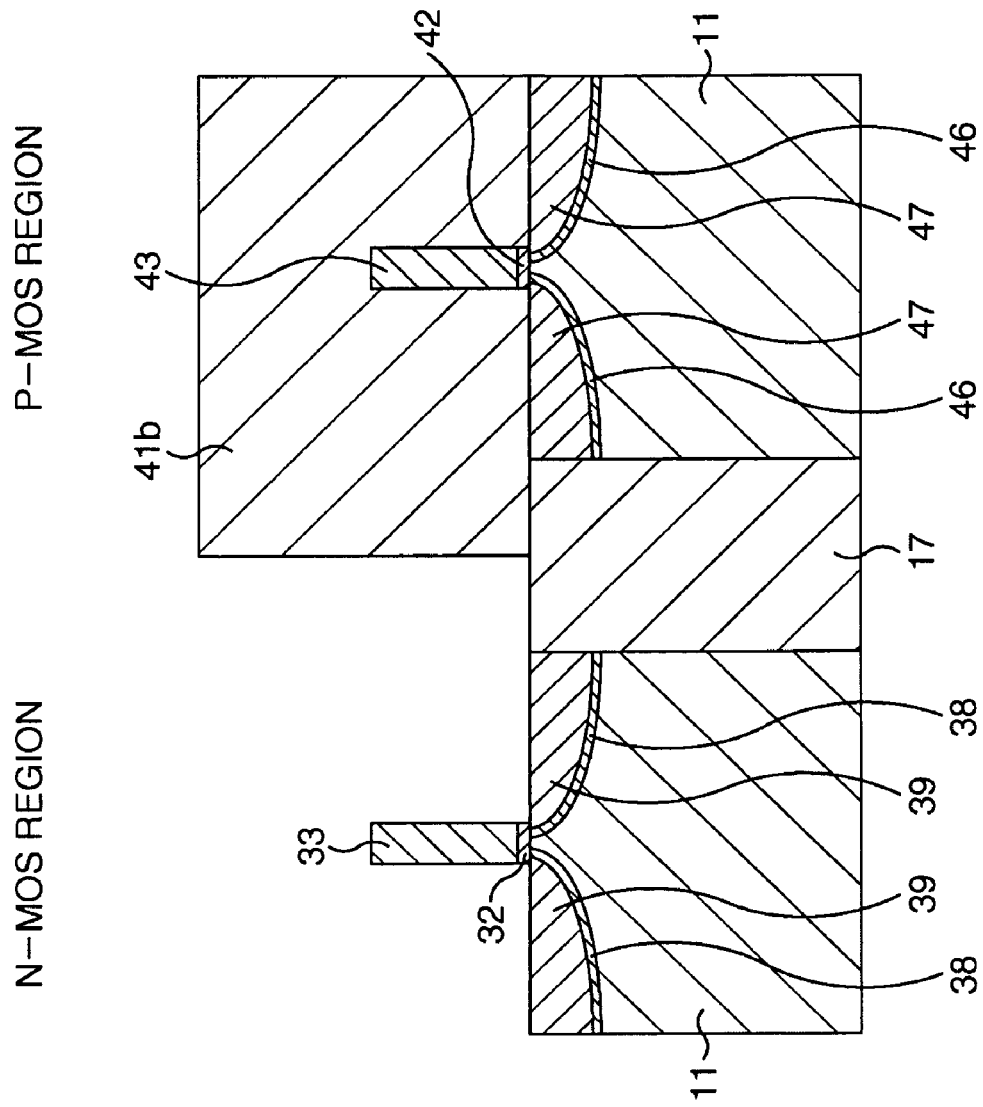
FIG. 26 is a schematic cross-sectional view, continued from FIG. 25, illustrating the manufacturing method of the CMOS transistor according to the sixth embodiment in order of process steps.

Subsequently, as illustrated in FIG. 26, pocket regions 38 and extension regions 39 are sequentially formed in the n-type MOS region.

More detailedly, first, after the resist mask 41a is removed by an ashing processing or the like, a resist mask 41b covering the p-type MOS region and exposing the n-type MOS region is formed by lithography.

Next, as for the n-type MOS region exposed from the resist mask 41b, in order to restrain a punch-through, a p-type impurity, here, boron (B) is ion-implanted in the surface layer of the silicon semiconductor substrate 11 under a condition of an acceleration energy of 10 keV and a dose amount of $1 \times 10^{13}/cm^2$, with the gate electrode 33 being a mask. Thereby, a pair of the pocket regions 38 is formed in the surface layer of the silicon semiconductor substrate 11 in both sides of the gate electrode 33.

Next, with the gate electrode 33 being a mask, an n-type impurity, here, arsenic (As) is ion-implanted in the surface layer of the silicon semiconductor substrate 11 under a condition of an acceleration energy of 5 keV and a dose amount of $1 \times 10^{14}/cm^2$. Thereby, a pair of the extension regions 39 is formed in a manner to be overlapped with the pocket regions 38 in the surface layer of the silicon semiconductor substrate 11 in the both sides of the gate electrode 33.

Figure 27:
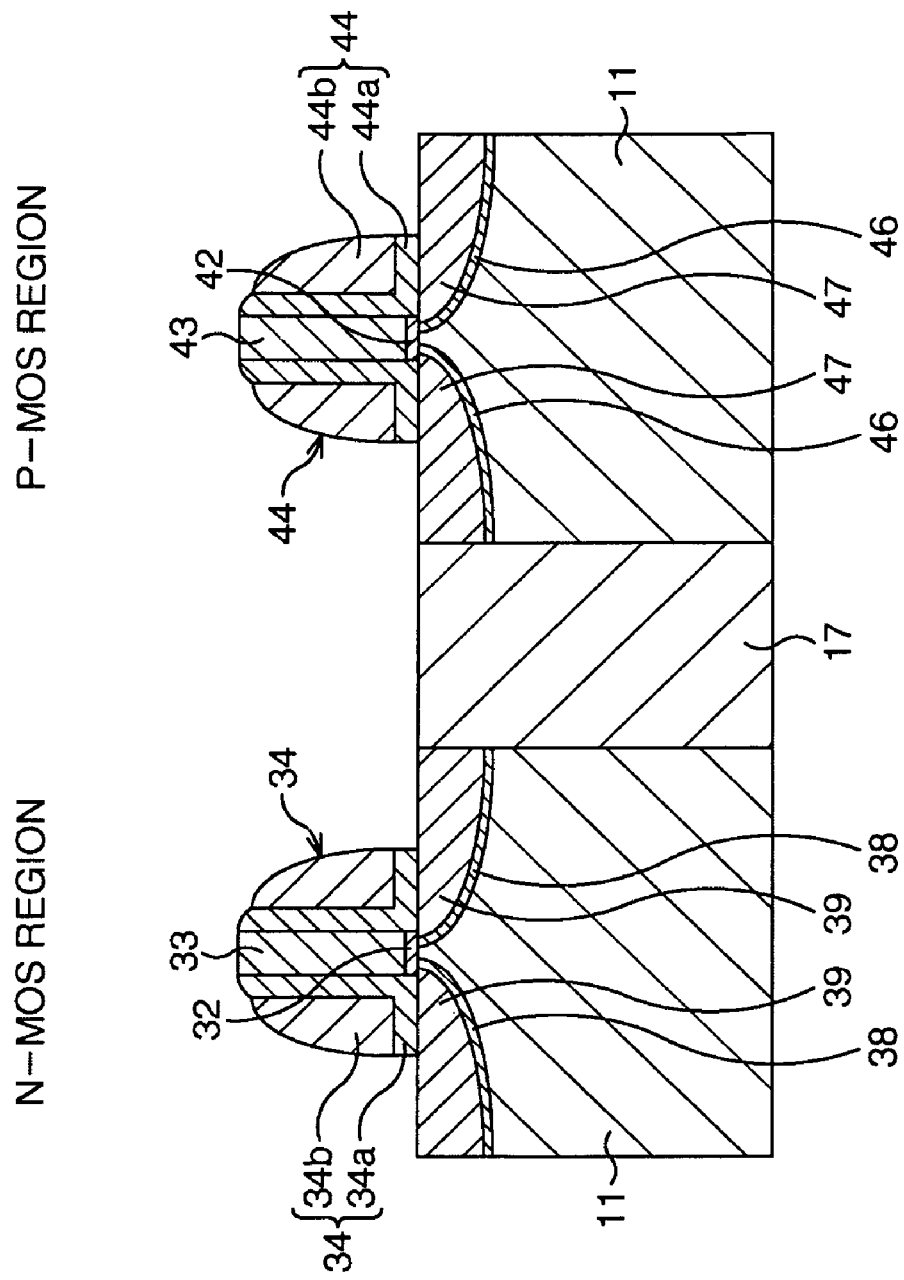
FIG. 27 is a schematic cross-sectional view, continued from FIG. 26, illustrating the manufacturing method of the CMOS transistor according to the sixth embodiment in order of process steps.

Subsequently, as illustrated in FIG. 27, a sidewall insulation film 34 is formed in the n-type MOS region, and at the same time, a sidewall insulation film 44 is formed in the p-type MOS region.

More detailedly, first, the resist mask 41b is removed by the ashing processing or the like.

Next, an insulation film, here, a silicon oxide film is deposited on an entire surface including the n-type MOS region and the p-type MOS region by a CVD method, in a manner to cover the gate electrodes 33, 43. Then, an entire surface is etch-backed (overall anisotropic etching) by an RIE and the silicon oxide film is left on both side surfaces of the gate electrodes 33, 43, so that inside sidewall insulation films 34a, 44a are formed.

Next, an insulation film of a material different from that of the inside sidewall insulation films 34a, 44a, here, a silicon nitride film is deposited on an entire surface including the n-type MOS region and the p-type MOS region by the CVD method, in a manner to cover the gate electrodes 33, 43 and the inside sidewall insulation films 34a, 44a. Then, an entire surface is etch-backed by the RIE and the silicon nitride film is left in a manner to cover the inside sidewall insulation films 34a, 44a, so that outside sidewall insulation films 34b, 44b are formed. At this time, the sidewall insulation film 34 constituted with the inside sidewall insulation film 34a and the outside sidewall insulation film 34b is formed in the n-type MOS region, and at the same time, the sidewall insulation film 44 constituted with the inside sidewall insulation film 44a and the outside sidewall insulation film 44b is formed in the p-type MOS region.

Figure 28:
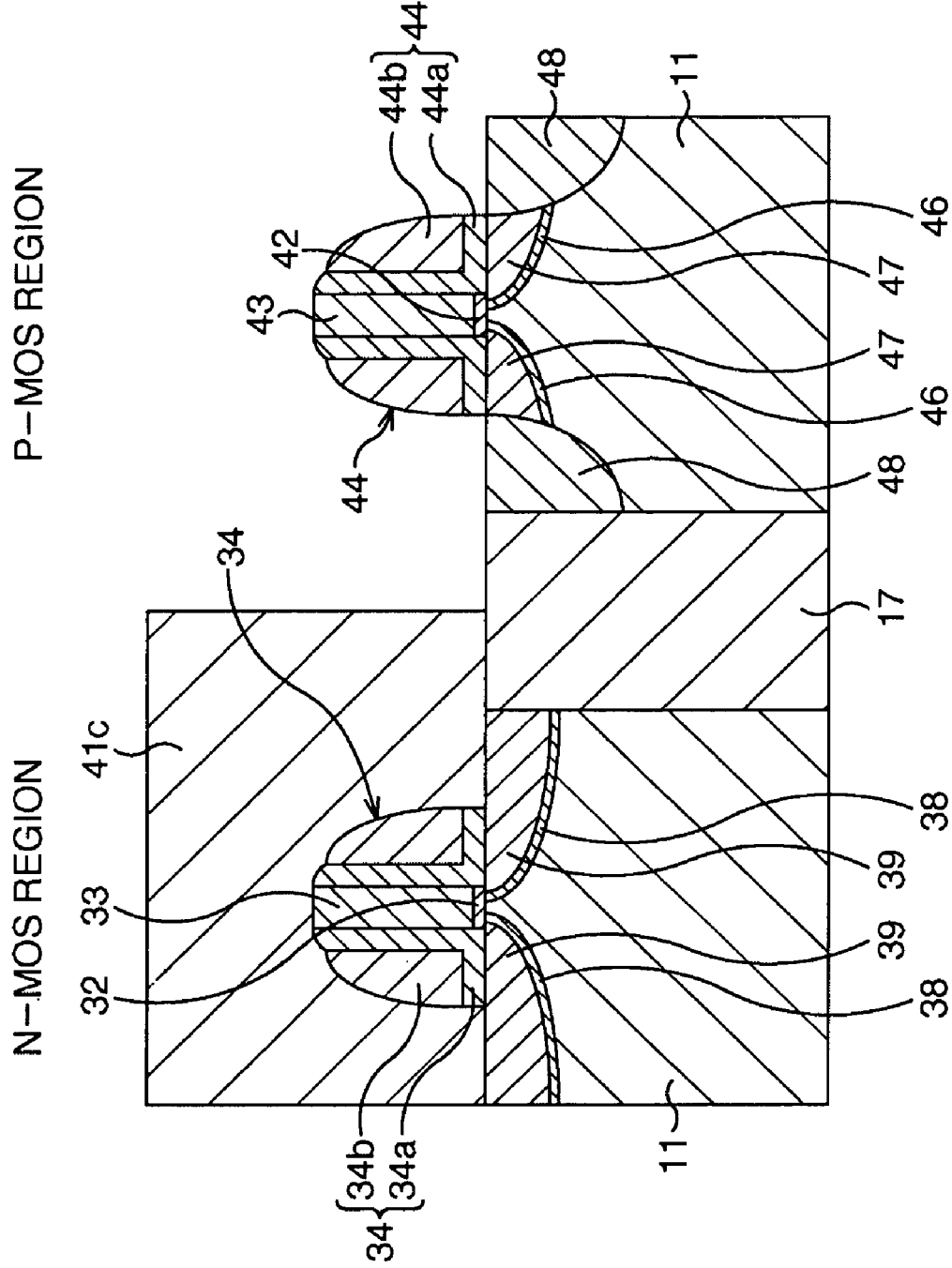
FIG. 28 is a schematic cross-sectional view, continued from FIG. 27, illustrating the manufacturing method of the CMOS transistor according to the sixth embodiment in order of process steps.

Subsequently, as illustrated in FIG. 28, source/drain regions 48 are formed in the p-type MOS region.

More detailedly, first, a resist mask 41C covering the n-type MOS region and exposing the p-type MOS region is formed by lithography.

Next, with the gate electrode 43 and the sidewall insulation film 44 being a mask, a p-type impurity, here, boron (B) is ion-implanted in the surface layer of the silicon semiconductor substrate 11 under a condition of an acceleration energy of 5 keV and a dose amount of $1 \times 10^{15}/cm^2$. Thereby, B is introduced into the gate electrode 43, and in the surface layer of the silicon semiconductor substrate 11 in both sides of the gate electrode 43, a pair of the source/drain regions 48 deeper than the extension regions 47 is formed in a manner to be partially overlapped with the pocket regions 46 and the pair of the extension regions 47.

Figure 29:
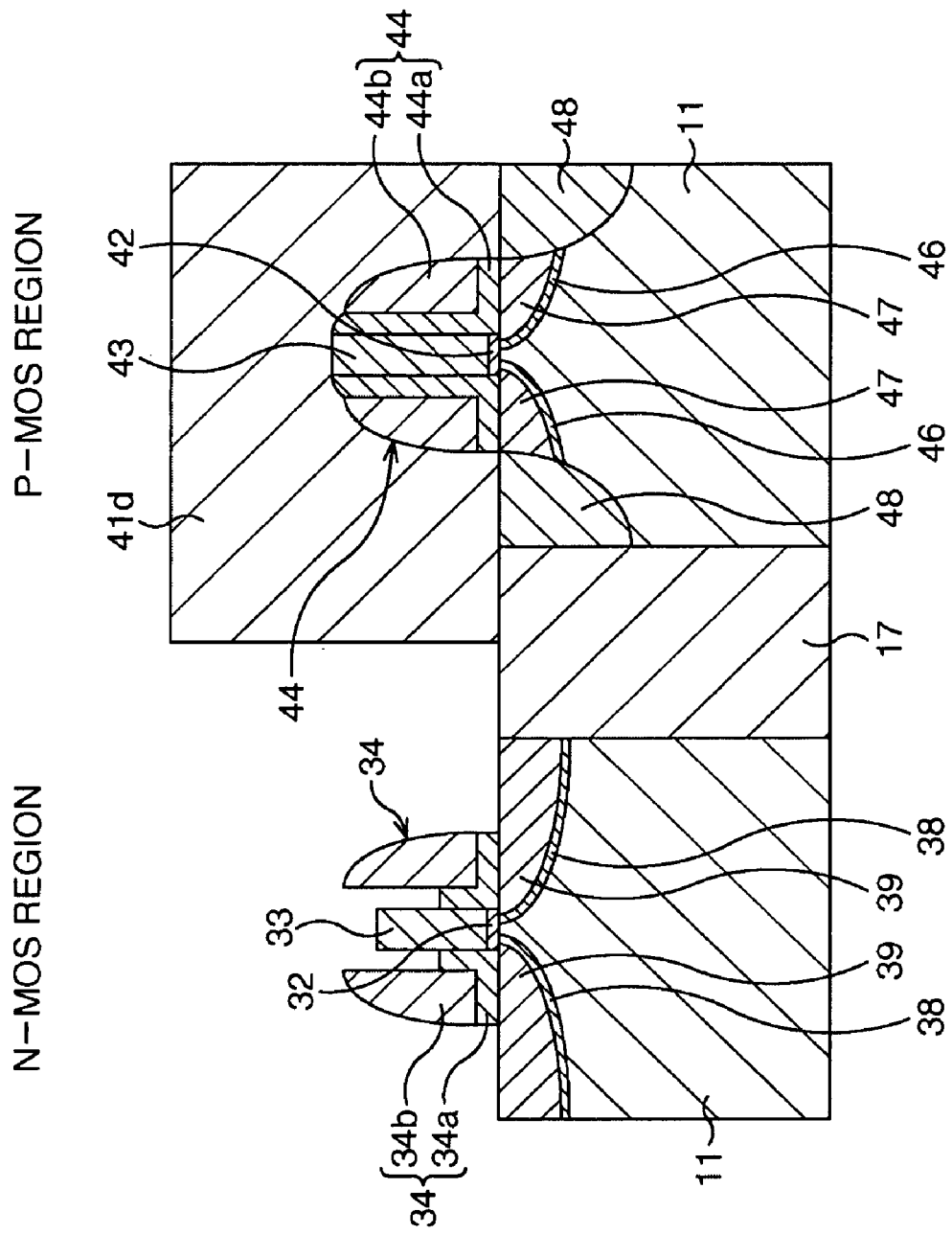
FIG. 29 is a schematic cross-sectional view, continued from FIG. 28, illustrating the manufacturing method of the CMOS transistor according to the sixth embodiment in order of process steps.

Subsequently, as illustrated in FIG. 29, in the n-type MOS region, the gate electrode 33 and the inside sidewall insulation film 34a are partially processed.

More detailedly, first, after the resist mask 41c is removed by the ashing processing or the like, a resist mask 41d covering the n-type MOS region and exposing the p-type MOS region is formed by lithography.

Next, only the gate electrode 33 is etched selectively in relation to the sidewall insulation film 34, by, for example, a wet etching using TMAH. Thereby, the gate electrode 33 becomes lower by a predetermined amount, so that an upper portion of the gate electrode 33 becomes lower than an upper portion of the sidewall insulation film 34.

Next, only the inside sidewall insulation film 34a is etched selectively in relation to the gate electrode 33 and the outside sidewall insulation film 34b by, for example, a wet etching using TMAH and hydrofluoric acid. Thereby, the inside sidewall insulation film 34a becomes lower by a predetermined amount, so an upper portion of the inside sidewall insulation film 34a becomes lower than the upper portion of the gate electrode 33.

Figure 30:
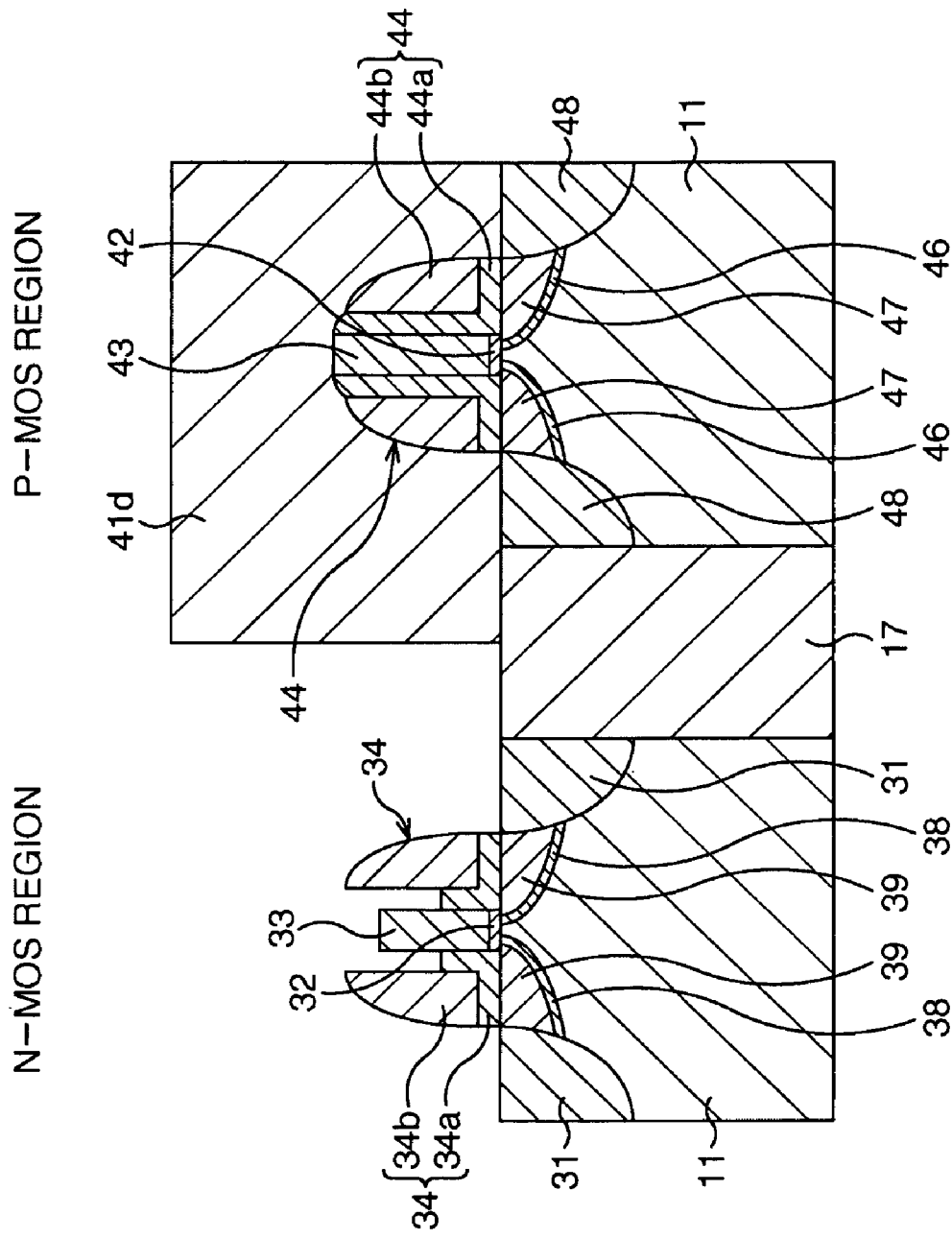
FIG. 30 is a schematic cross-sectional view, continued from FIG. 29, illustrating the manufacturing method of the CMOS transistor according to the sixth embodiment in order of process steps.

Subsequently, as illustrated in FIG. 30, source/drain regions 31 are formed in the n-type MOS region.

More detailedly, the resist mask 41d is continued to be used, and with the gate electrode 33 and the sidewall insulation film 34 being a mask, an n-type impurity, here, arsenic (As) is ion-implanted in the surface layer of the silicon semiconductor substrate 11 under a condition of an acceleration energy of 30 keV and a dose amount of $1 \times 10^{15}/cm^2$. Thereby, As is introduced into the gate electrode 33, and in the surface layer of the silicon semiconductor substrate 11 in the both sides of the gate electrode 33, a pair of the source/drain regions 31 deeper than the extension regions 39 are formed in a manner to be partially overlapped with the pocket regions 38 and the pair of the extension regions 39.

Then, after the resist mask 41d is removed by the ashing processing or the like, an annealing processing is performed at 1000° C. for about one second to activate various impurities introduced into the n-type MOS region and the p-type MOS region.

Figure 31:
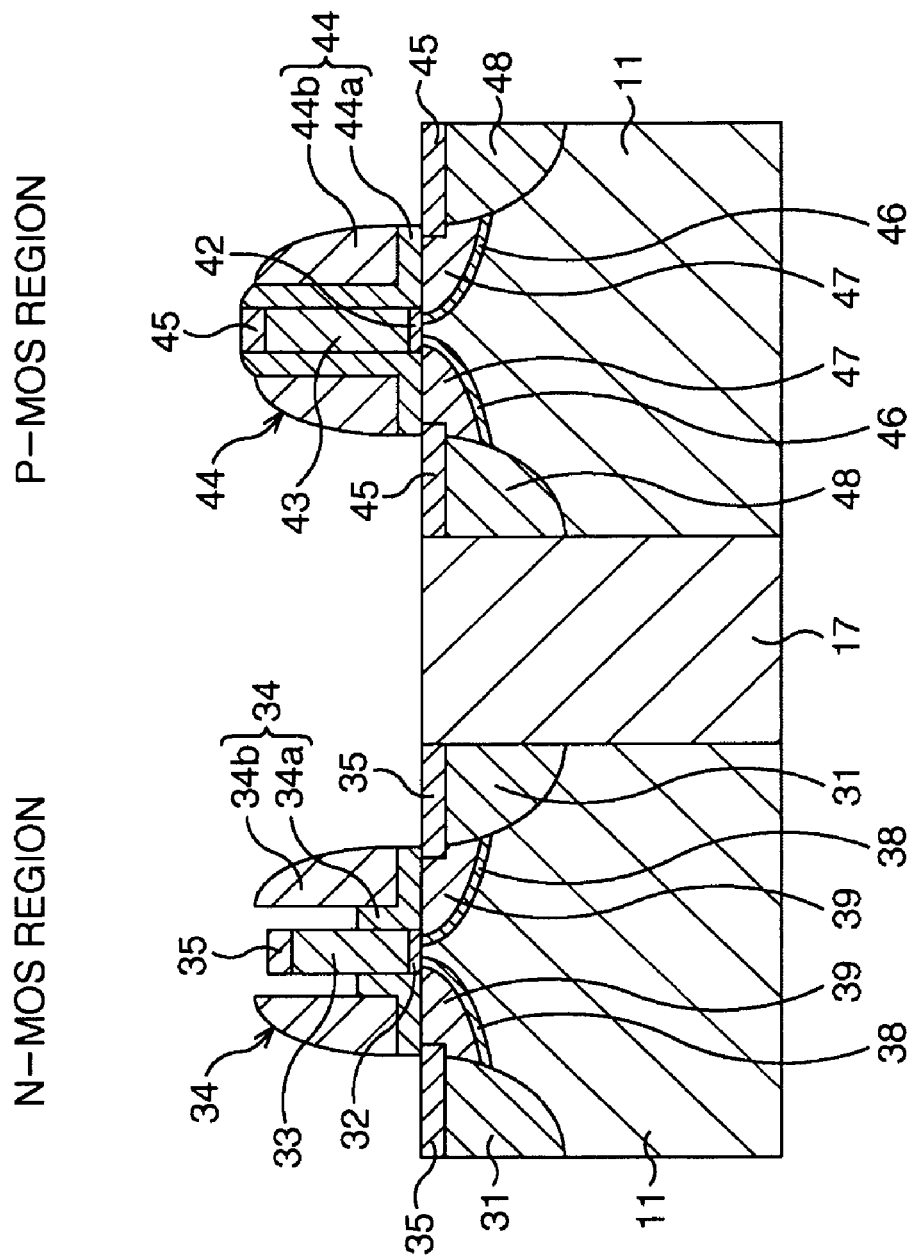
FIG. 31 is a schematic cross-sectional view, continued from FIG. 30, illustrating the manufacturing method of the CMOS transistor according to the sixth embodiment in order of process steps.

Subsequently, as illustrated in FIG. 31, silicide layers 35, 45 are formed in the n-type MOS region and the p-type MOS region to make salicide structures.

More detailedly, a metal (undepicted) which can be silicided with silicon, for example, Ni, Co, Ti or the like is deposited on an entire surface including the gate electrodes 33, 43 and the source/drain regions 31, 48 by a sputtering method or the like. Then, by performing a thermal processing, the deposited metal and silicon on the gate electrodes 33, 43 and on the source/drain regions 31, 48 are reacted. Thereafter, the unreacted metal is removed by a wet etching. Thereby, the silicide layers 35, 45 are each formed on the gate electrodes 33, 43 and on the source/drain regions 31, 48, so that the salicide structures are made in both the n-type MOS region and the p-type MOS region.

Figure 32:
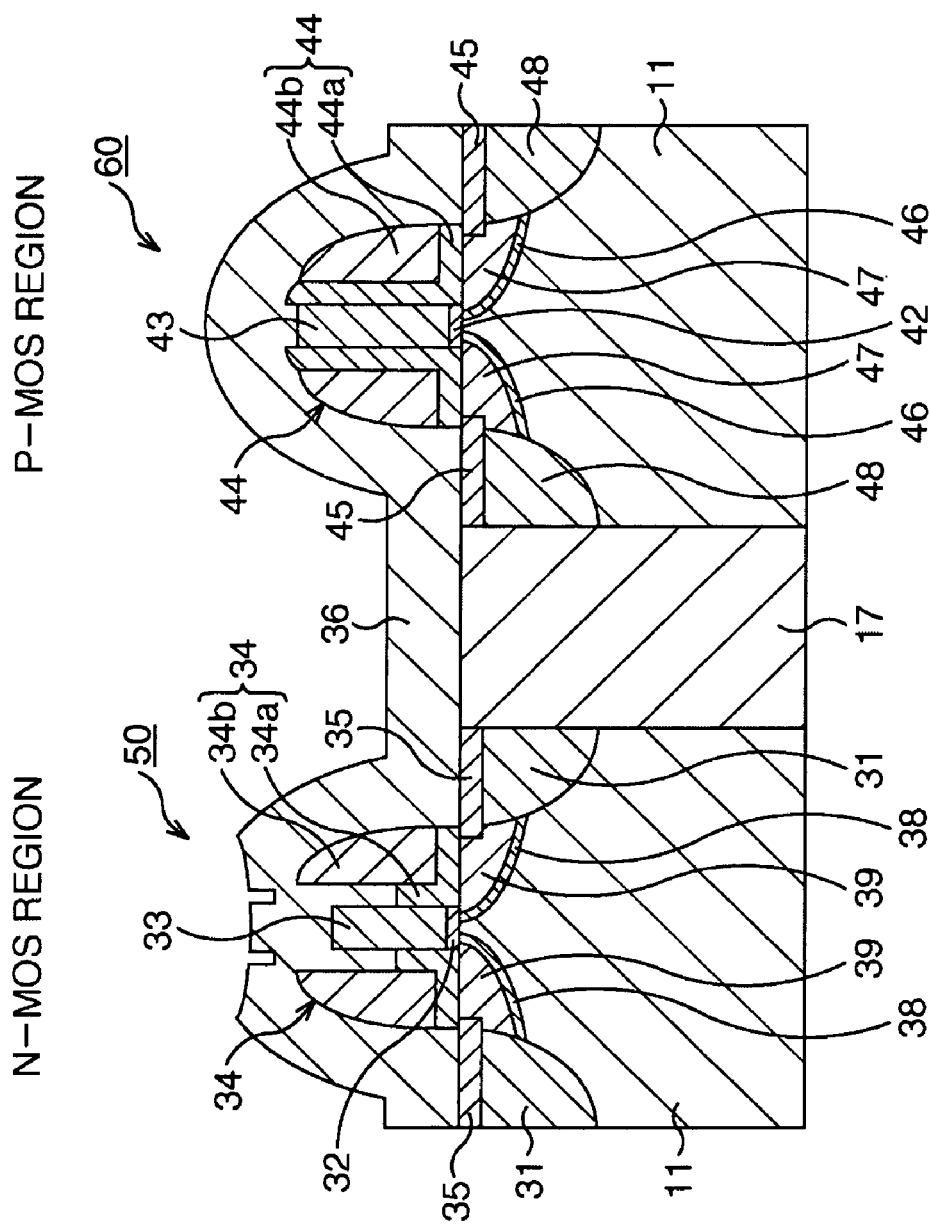
FIG. 32 is a schematic cross-sectional view, continued from FIG. 31, illustrating the manufacturing method of the CMOS transistor according to the sixth embodiment in order of process steps.
Figure 33A:
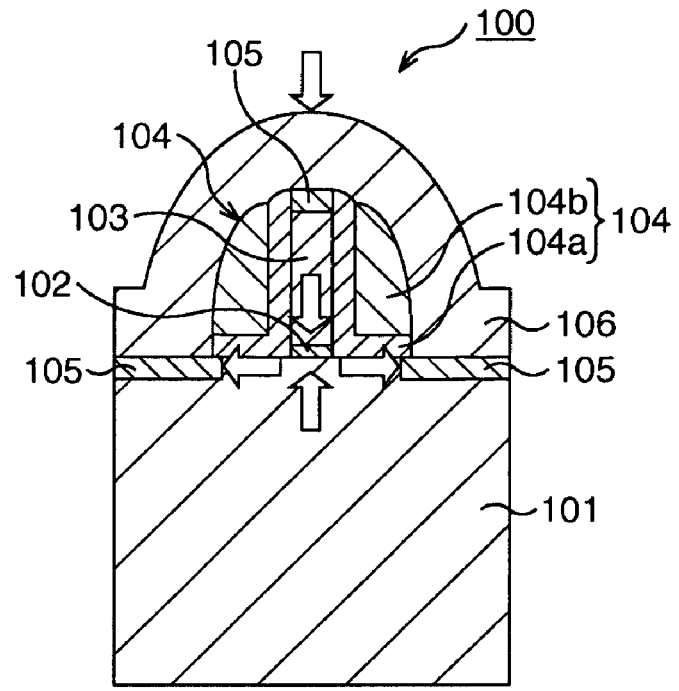
FIG. 33A is a schematic cross-sectional view illustrating a state that a desired stress is applied to a channel region of an n-type MOS transistor.
Figure 33B:
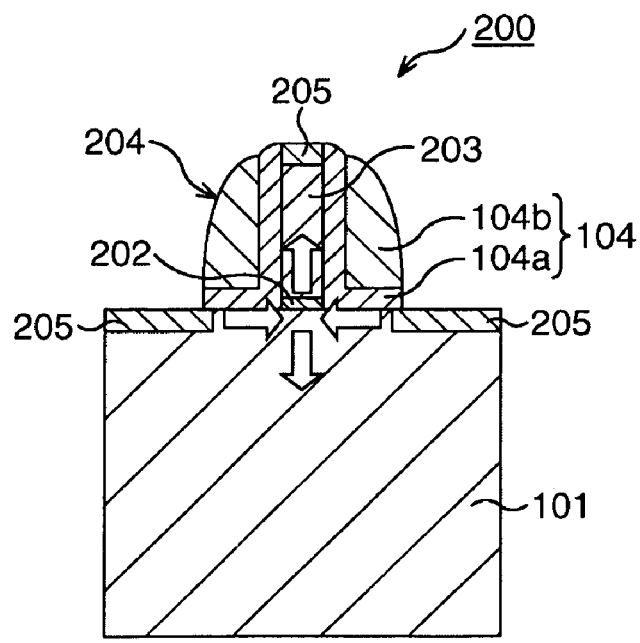
FIG. 33B is a schematic cross-sectional view illustrating a state that a desired stress is applied to a channel region of a p-type MOS transistor.

Subsequently, as illustrated in FIG. 32, a CESL film 36 is formed in a manner to cover the gate electrodes 33, 43, the sidewall insulation films 34, 44 and the source/drain regions 31, 48, on an entire surface including the n-type MOS region and the p-type MOS region.

More detailedly, a SiN film (undepicted) is deposited to be, for example, about 40 nm in film thickness on the entire surface including the n-type MOS region and the p-type MOS region by a plasma CVD method. The SiN film has C mixed thereinto. Thereby, there is formed the CESL film 36 being a SiN film having a property of applying a compressive stress to the outside by expanding itself.

Here, by the CESL film 36, in the p-type MOS region, a compressive stress is applied to a channel region and a compressive strain is introduced. On the other hand, in the n-type MOS region, due to shapes and a positional relation of the gate electrode 33 and the sidewall insulation film 34, a stress in a direction reverse to that in the p-type MOS region is applied, and a tensile stress is applied to a channel region in particular, so that a tensile strain is introduced.

Thereafter, after various processes such as formation of an interlayer insulation film, formation of a contact hole with the CESL film 36 being an etching stopper and formation of a wiring, an n-type MOS transistor 50 is formed in the n-type MOS region and a p-type MOS transistor 60 is formed in the p-type MOS region, so that a CMOS transistor is completed.

It should be noted that though the manufacturing method of the CMOS transistor of FIG. 6 is described in this embodiment, the present embodiments can be applied to a case that the n-type MOS transistor 40 in FIG. 4 is applied to a CMOS transistor to manufacture the CMOS transistor.

In this embodiment, though the CESL film 36 is formed in order to prevent an increase of process steps and complication of the process, in a manner to cover both the n-type MOS region and the p-type MOS region, the CESL film 36 ordinarily having a property of improving characteristics of a p-type MOS transistor and deteriorating characteristics of an n-type MOS transistor, transistor characteristics of both the n-type MOS transistor 50 and the p-type MOS transistor 60 are improved concurrently, so that a highly reliable CMOS transistor is realized.

According to the present embodiments, in one conductivity transistor, in spite of formation of an etching stop film which ordinarily has a property of giving a channel region a strain to improve characteristics of the other conductivity transistor and which gives the channel region a strain to deteriorate characteristics of that one conductivity transistor, in reality, a strain to improve characteristics of the transistor is given to the channel region and improvement of the characteristics of that one conductivity transistor is realized. According to the present embodiments, eventually in a complementary semiconductor device, in spite of formation of an etching stop film which ordinarily has a property of improving characteristics of one conductivity transistor and deteriorating characteristics of the other conductivity transistor in a manner to cover both n-channel transistor side and p-channel transistor side in order to prevent an increase of the number of process steps and complication of the process, the characteristics of both the transistors are concurrently improved and a highly reliable semiconductor device is realized.

INDUSTRIAL APPLICABILITY

According to the present embodiments, in one conductivity transistor, in spite of formation of an etching stop film which ordinarily has a property of giving a channel region a strain to improve characteristics of the other conductivity transistor and which gives the channel region a strain to deteriorate characteristics of that one conductivity transistor, in reality, a strain to improve characteristics of the transistor is given to a channel region and improvement of the characteristics of that one conductivity transistor is realized. According to the present embodiments, eventually in a complementary semiconductor device, in spite of formation of an etching stop film which ordinarily has a property of improving characteristics of one conductivity transistor and deteriorating characteristics of the other conductivity transistor in a manner to cover both n-channel transistor side and p-channel transistor side in order to prevent an increase of the number of process steps and complication of the process, the characteristics of both the transistors are concurrently improved and a highly reliable semiconductor device is realized.

What is claimed is:

1. A semiconductor device comprising:
a p-channel type transistor in a semiconductor region, the p-channel type transistor comprising:
a gate electrode formed above the semiconductor region;
a silicide layer formed above the gate electrode;
a sidewall insulation film formed over both side surfaces of the gate electrode;
a pair of p-type impurity diffusion regions formed in both sides of the gate electrode; and
a tensile stress insulation film formed to cover at least the gate electrode and the sidewall insulation film,
wherein the sidewall insulation film has an inside sidewall insulation film formed inside and an outside sidewall insulation film formed outside to cover at least part of the inside sidewall insulation film, and
wherein the upper surface of the silicide layer is lower than an upper portion of the outside sidewall insulation film and an upper portion of the inside sidewall insulation film is lower than the upper portion of the gate electrode.

2. The semiconductor device according to claim 1, further comprising:
an n-channel type transistor in addition to the p-channel type transistor in the semiconductor region, wherein
the tensile stress insulation film is formed to cover both the p-channel type transistor and the n-channel type transistor on the semiconductor region.

3. A semiconductor device comprising:
an n-channel type transistor in a semiconductor region, the n-channel type transistor comprising:
a gate electrode formed above the semiconductor region;
a silicide layer formed above the gate electrode;
a sidewall insulation film formed over both side surfaces of the gate electrode;
a pair of n-type impurity diffusion regions formed in both sides of the gate electrode; and
a compressive stress insulation film formed to cover at least the gate electrode and the sidewall insulation film,
wherein the sidewall insulation film has an inside sidewall insulation film formed inside and an outside sidewall insulation film formed outside to cover at least part of the inside sidewall insulation film, and wherein the upper surface of the silicide layer is lower than an upper portion of the outside sidewall insulation film and an upper portion of the inside sidewall insulation film is lower than the upper portion of the gate electrode.

4. The semiconductor device according to claim 3, further comprising:

a p-channel type transistor in addition to the n-channel type transistor in the semiconductor region, wherein the compressive stress insulation film is formed to cover both the n-channel type transistor and the p-channel type transistor on the semiconductor region.

5. A manufacturing method of a semiconductor device comprising a p-channel type transistor in a semiconductor region, the method comprising:

forming a gate electrode above the semiconductor region;

forming a sidewall insulation film over both side surfaces of the gate electrode;

forming a pair of p-type impurity diffusion regions in both sides of the gate electrode;

forming a tensile stress insulation film to cover at least the gate electrode and the sidewall insulation film; and further comprising:

in the forming the sidewall insulation film, after the sidewall insulation film has an inside sidewall insulation film formed inside and an outside sidewall insulation film formed outside to cover at least part of the inside sidewall insulation film, selectively removing part of the gate electrode so that the upper portion of the gate electrode becomes lower than an upper portion of the outside sidewall insulation film and selectively removing part of the inside sidewall insulation film so that an upper portion of the inside sidewall insulation film becomes lower than the upper portion of the gate electrode; and independently adjusting respective amounts removed from the gate electrode and the sidewall insulation film.

6. The manufacturing method of the semiconductor device according to claim 5, wherein in the partially removing the upper portion of the gate electrode and the inside sidewall insulation film, the gate electrode is partially removed selectively by a first wet etching, and the inside sidewall insulation film is partially removed selectively by a second wet etching.

7. The manufacturing method of the semiconductor device according to claim 5, wherein, in forming an n-channel type transistor in addition to the p-channel type transistor in the semiconductor region, the tensile stress insulation film is formed to cover both the p-channel type transistor and the n-channel type transistor on the semiconductor region.

8. A manufacturing method of a semiconductor device comprising an n-channel type transistor in a semiconductor region, the method comprising:

forming a gate electrode above the semiconductor region;

forming a sidewall insulation film on both side surfaces of the gate electrode;

forming a pair of n-type impurity diffusion regions in both sides of the gate electrode; and forming a compressive stress insulation film to cover at least the gate electrode and the sidewall insulation film; further comprising:

in the forming the sidewall insulation film, after the sidewall insulation film has an inside sidewall insulation film formed inside and an outside sidewall insulation film formed outside to cover at least part of the inside sidewall insulation film, selectively removing part of the gate electrode so that the upper portion of the gate electrode becomes lower than an upper portion of the outside sidewall insulation film and selectively removing part of the inside sidewall insulation film so that an upper portion of the inside sidewall insulation film becomes lower than the upper portion of the gate electrode; and independently adjusting respective amounts removed from the gate electrode and the sidewall insulation film.

9. The manufacturing method of the semiconductor device according to claim 8, wherein, in the partially removing the upper portion of the gate electrode and the inside sidewall insulation film, the gate electrode is partially removed selectively by a first wet etching, and the inside sidewall insulation film is partially removed selectively by a second wet etching.

10. The manufacturing method of the semiconductor device according to claim 8, wherein, in forming a p-channel type transistor in addition to the n-channel type transistor in the semiconductor region, the compressive stress insulation film is formed to cover both the n-channel type transistor and the p-channel type transistor on the semiconductor region.

* * * * *